US012720669B2

(12) United States Patent
Ikemoto et al.

(10) Patent No.: US 12,720,669 B2
(45) Date of Patent: Aug. 25, 2026

(54) MULTILAYER SUBSTRATE, ELECTRONIC APPARATUS, AND METHOD FOR MANUFACTURING MULTILAYER SUBSTRATE

(71) Applicant: Murata Manufacturing Co., Ltd., Nagaokakyo (JP)

(72) Inventors: Nobuo Ikemoto, Nagaokakyo (JP); Noriaki Okuda, Nagaokakyo (JP); Kosuke Nishio, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 453 days.

(21) Appl. No.: 18/217,675

(22) Filed: Jul. 3, 2023

(65) Prior Publication Data

US 2023/0345624 A1 Oct. 26, 2023

Related U.S. Application Data

(63) Continuation of application No. PCT/JP2021/047015, filed on Dec. 20, 2021.

(30) Foreign Application Priority Data

Jan. 8, 2021 (JP) ................................ 2021-001921

(51) Int. Cl.

*H05K 1/02* (2006.01)
*H01P 3/08* (2006.01)
*H01P 11/00* (2006.01)
*H05K 1/03* (2006.01)
*H05K 3/00* (2006.01)

(52) U.S. Cl.

CPC ............ *H05K 1/0243* (2013.01); *H01P 3/08* (2013.01); *H01P 11/003* (2013.01); *H05K 1/03* (2013.01);

(Continued)

(58) Field of Classification Search

CPC ........ H05K 1/0243; H05K 1/03; H05K 1/028; H05K 1/162; H05K 1/118; H05K 1/189;

(Continued)

(56) References Cited

U.S. PATENT DOCUMENTS 4,382,236 A 5/1983 Suzuki
5,346,750 A 9/1994 Hatakeyama et al.

(Continued)

FOREIGN PATENT DOCUMENTS

JP 56158502 A 12/1981
JP 06268345 A 9/1994

(Continued)

OTHER PUBLICATIONS

International Search Report in PCT/JP2021/047015, mailed Mar. 15, 2022, 3 pages.

(Continued)

*Primary Examiner* — Roshn K Varghese
(74) *Attorney, Agent, or Firm* — Keating & Bennett, LLP

(57) ABSTRACT

A multilayer substrate includes a multilayer body including insulation layers stacked on top of one another in an up-and-down direction. The insulation layers include a porous insulation layer. The multilayer substrate includes a first region and a second region. A dimension of the porous insulation layer in the up-and-down direction is smaller in the first region than in the second region. An average void size of the porous insulation layer is smaller in the first region than in the second region, and/or the porous insulation layer is denser in the first region than in the second region.

21 Claims, 39 Drawing Sheets

(52) U.S. Cl.
CPC . *H05K 3/0011* (2013.01); *H05K 2201/10015* (2013.01); *H05K 2201/10098* (2013.01)

(58) Field of Classification Search
CPC .. H05K 1/0283; H05K 1/0277; H05K 1/0278; H05K 1/0393; H05K 2201/10015; H05K 2201/10098; H05K 2201/0016; H05K 2201/0187; H05K 2201/09063; H01P 3/08; H01P 3/085; H01P 11/003
See application file for complete search history.

(56) References Cited

U.S. PATENT DOCUMENTS 12,197,255 B2 * 1/2025 Park .................... G06F 1/1656
2013/0087375 A1 * 4/2013 Tsunoi ................ H05K 1/0278 174/250
2014/0354900 A1 * 12/2014 Qian .................... H05K 1/028 174/254
2016/0156087 A1 6/2016 Baba et al.
2017/0135197 A1 * 5/2017 Huitema ............. H05K 1/0271
2017/0279191 A1 9/2017 Yosui et al.

FOREIGN PATENT DOCUMENTS

JP 2003008233 A 1/2003
WO 2015118791 A1 8/2015
WO 2016181782 A1 11/2016

OTHER PUBLICATIONS

Written Opinion in PCT/JP2021/047015, mailed Mar. 15, 2022, 4 pages.

* cited by examiner 10b
12
20a
16a
16b
16c
16d
20b
32
30
24
22
26
v2
v1
A1
A2
U
D
L
R
B
F 10c
12
16a
16b
16c
16d
20b
32
30
40
20a
24
26
22
v1
v2
A1
A2
U
D
L
R
B
F A2
A1
A1
A2
10d
v1
v2
22
10b,12
24
26
60
U
D
L
R
B
F

MULTILAYER SUBSTRATE, ELECTRONIC APPARATUS, AND METHOD FOR MANUFACTURING MULTILAYER SUBSTRATE

CROSS REFERENCE TO RELATED APPLICATIONS

This application claims the benefit of priority to Japanese Patent Application No. 2021-001921 filed on Jan. 8, 2021 and is a Continuation Application of PCT Application No. PCT/JP2021/047015 filed on Dec. 20, 2021. The entire contents of each application are hereby incorporated herein by reference.

BACKGROUND OF THE INVENTION

1. Field of the Invention

The present invention relates to a multilayer substrate including insulation layers arranged in a stack and also relates to an electronic apparatus and a method for manufacturing a multilayer substrate.

2. Description of the Related Art

Examples of such a multilayer substrate known in the art include a multilayer circuit board disclosed in Japanese Unexamined Patent Application Publication No. 6-268345. The multilayer circuit board includes porous base substrates arranged in a stack.

SUMMARY OF THE INVENTION

The multilayer circuit board disclosed in Japanese Unexamined Patent Application Publication No. 6-268345, that is, the multilayer circuit board including porous base substrates arranged in a stack, has room for improvement in meeting the demand for a higher degree of design flexibility.

Preferred embodiments of the present invention provide multilayer substrates, electronic apparatuses, and methods for manufacturing multilayer substrates, with a view toward a greater degree of flexibility in the design of the multilayer substrate.

According to an aspect of the present invention, a multilayer substrate includes a multilayer body including a plurality of insulation layers stacked on top of one another in an up-and-down direction, the plurality of insulation layers including a porous insulation layer, wherein the multilayer substrate includes a first region and a second region, a dimension of the porous insulation layer in the up-and-down direction is smaller in the first region than in the second region, and an average void size of the porous insulation layer is smaller in the first region than in the second region, and/or the porous insulation layer is denser in the first region than in the second region.

According to another aspect of the present invention, a method for manufacturing a multilayer substrate includes stacking a plurality of insulation layers including a porous insulation layer made of a porous material on top of one another in an up-and-down direction, and pressing the plurality of insulation layers, wherein the multilayer substrate includes a first region and a second region, once the plurality of insulation layers undergo the pressing, a dimension of the porous insulation layer in the up-and-down direction is smaller in the first region than in the second region, an average void size of the porous insulation layer is smaller in the first region than in the second region, and/or the porous insulation layer is denser in the first region than in the second region.

Preferred embodiments of the present invention provide multilayer substrates, electronic apparatuses, and methods for manufacturing multilayer substrates, each offering a greater degree of flexibility in the design of the multilayer substrate.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 18 is a sectional view of a multilayer substrate 10*j*.

FIG. 21 is a sectional view of the multilayer substrate 10*l* in the process of being manufactured.

DETAILED DESCRIPTION OF THE PREFERRED EMBODIMENTS

Preferred Embodiment

Structure of Multilayer Substrate 10

Figure 1:
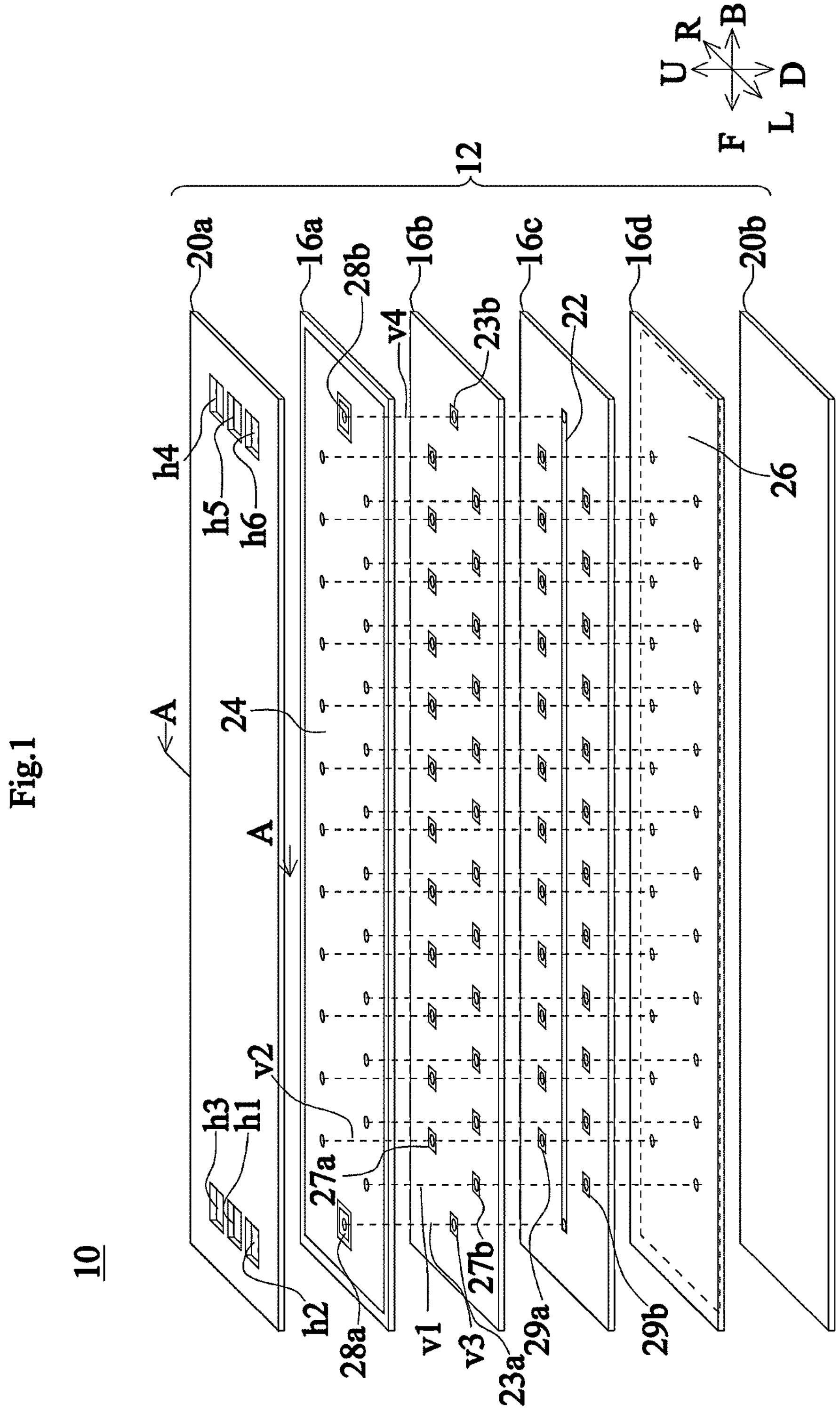
FIG. 1 is an exploded perspective view of a multilayer substrate 10.
Figure 2:
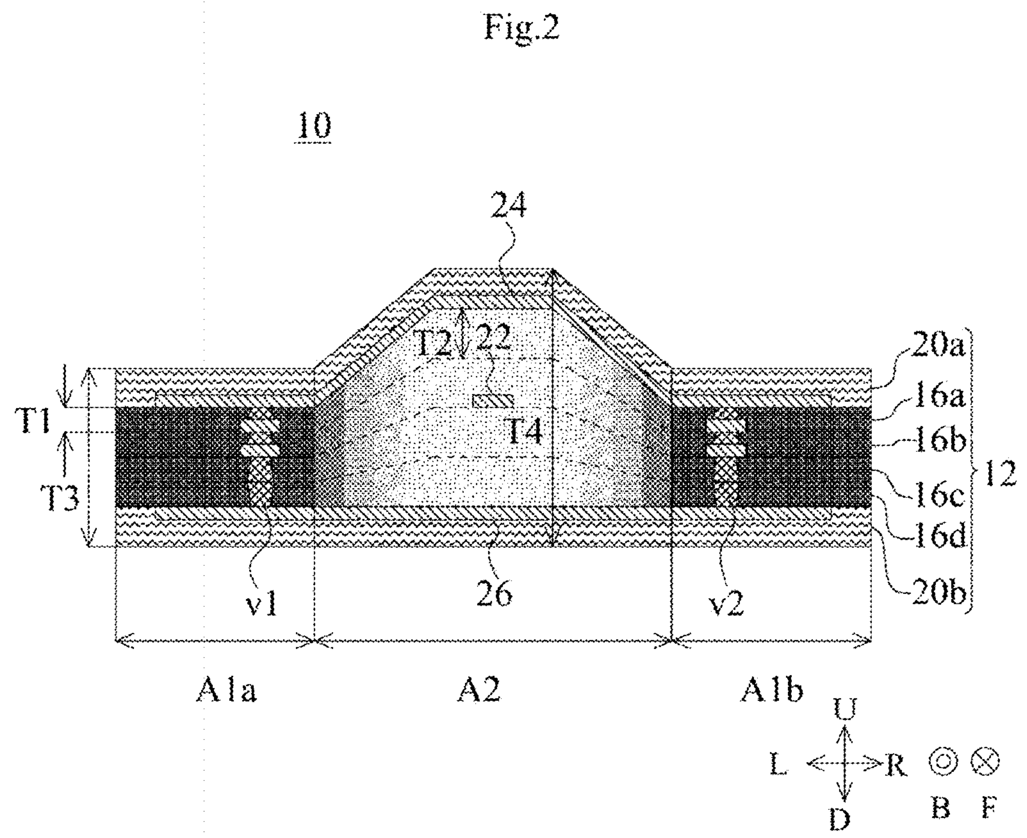
FIG. 2 is a sectional view of the multilayer substrate 10 taken along line A-A in FIG. 1.

Hereinafter, the structure of a multilayer substrate 10 according to a preferred embodiment of the present invention will be described with reference to the accompanying drawings. FIG. 1 is an exploded perspective view of the multilayer substrate 10. In FIG. 1, interlayer connection conductors that are representative of those included in the multilayer substrate 10 are denoted by v1 and v2, respectively. FIG. 2 is a sectional view of the multilayer substrate 10 taken along line A-A in FIG. 1.

The directions are herein defined as follows. The up-and-down direction is the direction in which layers of a multilayer body 12 of the multilayer substrate 10 are stacked on top of one another. The front-and-back direction is the longitudinal direction of a signal conductor layer 22 of the multilayer substrate 10. The left-and-right direction is the line width direction of the signal conductor layer 22. The up-and-down direction, the front-and-back direction, and the left-and-right direction are orthogonal to each other. The up-and-down direction, the front-and-back direction, and the left-and-right direction mentioned herein be in agreement with the respective directions of the multilayer substrate 10 in actual use.

Given that components and members of the multilayer substrate 10 are each referred to as X, each portion of X is defined as follows unless otherwise specified. The front half of X is herein referred to as a front portion. The back half of X is herein referred to as a back portion. The left half of X is herein referred to as a left portion. The right half of X is herein referred to as a right portion. The upper half of X is herein referred to as an upper portion. The lower half of X is herein referred to as a lower portion. The end on the front side of X is herein referred to a front end. The end on the back side of X is herein referred to a back end. The end on the left side of X is herein referred to a left end. The end on the right side of X is herein referred to a right end. The end on the upper side of X is herein referred to an upper end. The end on the lower side of X is herein referred to a lower end. The portion including the front end of X is herein referred to as a front end portion. The portion including the back end of X is herein referred to as a back end portion. The portion including the left end of X is herein referred to as a left end portion. The portion including the right end of X is herein referred to as a right end portion. The portion including the upper end of X is herein referred to as an upper end portion. The portion including the lower end of X is herein referred to as a lower end portion.

The following describes the structure of the multilayer substrate 10 with reference to FIG. 1. Radio-frequency signals are transmitted through the multilayer substrate 10. The multilayer substrate 10 is included in an electronic apparatus, such as a smartphone, and is for use in forming an electrical connection between two circuits of the electronic apparatus. Referring to FIG. 1, the multilayer substrate 10 includes the multilayer body 12, the signal conductor layer 22, a first ground conductor layer 24, a second ground conductor layer 26, a signal terminal 28*a*, a signal terminal 28*b*, a connection conductor layer 23*a*, a connection conductor layer 23*b*, a connection conductor layer 27*a*, a connection conductor layer 27*b*, a connection conductor layer 29*a*, a connection conductor layer 29*b*, the interlayer connection conductors v1, the interlayer connection conductors v2, an interlayer connection conductor v3, and an interlayer connection conductor v4.

The multilayer body 12 is plate-shaped. The multilayer body 12 includes an upper main surface and a lower main surface. The up-and-down direction is normal to the upper main surface and the lower main surface of the multilayer body 12. The upper main surface and the lower main surface of the multilayer body 12 each have a rectangular or substantially rectangular shape whose long sides extend in the front-and-back direction. That is, the multilayer body 12 is longer in the front-and-back direction than in the left-and-right direction.

Referring to FIG. 1, the multilayer body 12 includes insulation layers respectively denoted by 16*a* to 16*d*, 20*a*, and 20*b*. The insulation layers 16*a* to 16*d*, 20*a*, and 20*b* of the multilayer body 12 are stacked on top of one another in the up-and-down direction. The insulation layers 20*a*, 16*a* to 16*d*, and 20*b* are arranged in the stated order from top to bottom. The insulation layers 16*a* to 16*d* are rectangular or substantially rectangular and identical in shape to the multilayer body 12 when viewed in the up-and-down direction. The insulation layers 16*a* to 16*d* are dielectric sheets that are flexible. The insulation layers 16*a* to 16*d* are made of a material including thermoplastic resin. Examples of the thermoplastic resin that may be included in the material of the insulation layers 16*a* to 16*d* include liquid crystal polymer and polytetrafluoroethylene (PTFE). Alternatively, the insulation layers 16*a* to 16*d* may be made polyimide. The insulation layers 16*a* to 16*d* are porous insulation layers made of porous materials. That is, the insulation layers 16*a* to 16*d* include a multitude of voids. That is, each of the insulation layers 16*a* to 16*d* is a closed-cell foam in which major voids are discrete air bubbles. That is, voids in the insulation layers 16*a* to 16*d* each being a closed-cell foam are each entirely surrounded with the material of the insulation layer. These discrete air bubbles are not connected to each other. Not all of the voids in the insulation layers 16*a* to 16*d* are necessarily discrete air bubbles. For example, the porosity of each of the insulation layers 16*a* to 16*d* is not less than about 30% and not more than about 80%. The porosity of the multilayer body 12 is the ratio of the volume of air bubbles to the overall volume of the multilayer body 12. The insulation layers 20*a* and 20*b* will be described in detail later.

The signal conductor layer 22 (conductor layer) is disposed on an upper main surface or a lower main surface of the insulation layer 16*c* (porous insulation layer). The signal conductor layer 22 in the present preferred embodiment is disposed on the upper main surface of the insulation layer 16*c*. The signal conductor layer 22 is linear in shape. The signal conductor layer 22 extends in the front-and-back direction. Radio-frequency signals are fed into the signal conductor layer 22.

The first ground conductor layer 24 is included in the multilayer body 12. The first ground conductor layer 24 is disposed above the signal conductor layer 22. More specifically, the signal conductor layer 22 is located within the area enclosed with the periphery of the first ground conductor layer 24 when viewed in the up-and-down direction. The first ground conductor layer 24 in the present preferred embodiment is disposed on an upper main surface of the insulation layer 16*a*. The first ground conductor layer 24 extends substantially all over the upper main surface of the insulation layer 16*a*. The first ground conductor layer 24 is connected to the ground potential.

The second ground conductor layer 26 is included in the multilayer body 12. The second ground conductor layer 26 is disposed below the signal conductor layer 22. More specifically, the signal conductor layer 22 is located within the area enclosed with the periphery of the second ground conductor layer 26 when viewed in the up-and-down direction. The second ground conductor layer 26 in the present preferred embodiment is disposed on a lower main surface of the insulation layer 16*d*. The second ground conductor layer 26 in the present preferred embodiment extends substantially all over the lower main surface of the insulation layer 16*d*. The second ground conductor layer 26 is connected to the ground potential. The signal conductor layer 22 (conductor layer), the first ground conductor layer 24, and the second ground conductor layer 26 are provided in a strip-line geometry to provide a radio-frequency circuit.

The connection conductor layers 23*a*, 23*b*, 27*a*, and 27*b* are disposed on an upper main surface of the insulation layer 16*b*. The connection conductor layers 23*a*, 23*b*, 27*a*, and 27*b* are each square in shape when viewed in the up-and-down direction. The connection conductor layers 29*a* and 29*b* are disposed on the upper main surface of the insulation layer 16*c*.

The interlayer connection conductors v1 and the interlayer connection conductors v2 each provide an electrical connection between the first ground conductor layer 24 and the second ground conductor layer 26. More specifically, the interlayer connection conductors v1 and the interlayer connection conductors v2 each extend through the insulation layers 16*a* to 16*d* in the up-and-down direction. The interlayer connection conductors v1 and the interlayer connection conductors v2 each include an upper end connected to the first ground conductor layer 24. The interlayer connection conductors v1 and the interlayer connection conductors v2 each include a lower end connected to the second ground conductor layer 26. The interlayer connection conductors v1 each include a middle portion connected to the connection conductor layers 27*b* and 29*b* (conductor layers). The interlayer connection conductors v2 each include a middle portion connected to the connection conductor layers 27*a* and 29*a* (conductor layers). The interlayer connection conductors v1 are located on the left side with respect to the signal conductor layer 22. The interlayer connection conductors v1 are arranged in a line with equal spaces in the front-and-back direction. The interlayer connection conductors v2 are located on the right side with respect to the signal conductor layer 22. The interlayer connection conductors v2 are arranged in a line with equal or substantially equal spaces in the front-and-back direction.

The signal terminal 28*a* is disposed on a front end portion of the upper main surface of the insulation layer 16*a*. The signal terminal 28*a* is rectangular or substantially rectangular in shape when viewed in the up-and-down direction. The signal terminal 28*a* overlaps a front end portion of the signal conductor layer 22 when viewed in the up-and-down direction. With a clearance being left between the signal terminal 28*a* and the first ground conductor layer 24, the signal terminal 28*a* is insulated from the first ground conductor layer 24.

The interlayer connection conductor v3 provides an electrical connection between the signal terminal 28*a* and the signal conductor layer 22. More specifically, the interlayer connection conductor v3 extends through the insulation layers 16*a* and 16*b* in the up-and-down direction. The interlayer connection conductor v3 includes an upper end connected to the signal terminal 28*a*. The interlayer connection conductor v3 includes a lower end connected to the front end portion of the signal conductor layer 22. The interlayer connection conductor v3 includes a middle portion connected to the connection conductor layer 23*a*. The signal terminal 28*a* is electrically connected to the signal conductor layer 22 accordingly. Radio-frequency signals are input to and output from the signal conductor layer 22 via the signal terminal 28*a*.

The arrangement of the signal terminal 28*a*, the connection conductor layer 23*a*, and the interlayer connection conductor v3 on the front and the arrangement of the signal terminal 28*b*, the connection conductor layer 23*b*, and the interlayer connection conductor v4 on the back are symmetrical. Thus, the signal terminal 28*b*, the connection conductor layer 23*b*, and the interlayer connection conductor v4 will not be further described here.

The signal conductor layer 22, the first ground conductor layer 24, the second ground conductor layer 26, the signal terminals 28*a* and 28*b*, and the connection conductor layers 23*a*, 23*b*, 27*a*, 27*b*, 29*a*, and 29*b* are formed by the etching process in which conductor foil on upper main surfaces and lower main surfaces of the insulation layers 16*a* to 16*d* are etched. For example, the conductor foil is copper foil. As illustrated in FIG. 2, the interlayer connection conductors v1 to v4 each include via hole conductors connected in series. The via hole conductors are obtained by the solidification of a conductive paste that is filled in the through holes formed in the insulation layers 16*a* to 16*d*. Alternatively, the via hole conductors may be formed by the application of plating to the through holes.

The insulation layers 20*a* and 20*b* are flexible. The insulation layers 20*a* and 20*b* are rectangular or substantially rectangular and identical in shape to the multilayer body 12 when viewed in the up-and-down direction. The insulation layer 20*a* extends substantially all over the upper main surface of the insulation layer 16*a*. The first ground conductor layer 24 is protected by the insulation layer 20*a* accordingly. The insulation layer 20*a* has cavities h1 to h6. The signal terminal 28*a* is located within the cavity h1 when viewed in the up-and-down direction. The signal terminal 28*a* in the cavity h1 is thus exposed to view from the outside of the multilayer substrate 10. The cavity h2 is located on the left side of the cavity h1. The cavity h3 is located on the right side of the cavity h1. The first ground conductor layer 24 in the cavities h2 and h3 is thus exposed to view from the outside of the multilayer substrate 10. The arrangement of the cavities h1 to h3 on the front and the arrangement of the cavities h4 to h6 on the back are symmetrical. Thus, the cavities h4 to h6 will not be further described.

The insulation layer 20*b* extends substantially all over the lower main surface of the insulation layer 16*d*. The second ground conductor layer 26 is protected by the insulation layer 20*b* accordingly.

Referring to FIG. 2, the multilayer substrate 10 includes first regions A1*a* and A1*b* and a second region A2. The first region A1*a* is in the left portion of the multilayer substrate 10. The first region A1*a* has a rectangular or substantially rectangular shape whose long sides extend in the front-and-back direction when viewed in the up-and-down direction. The first region A1*b* is in the right portion of the multilayer substrate 10. The first region A1*b* has a rectangular or substantially rectangular shape whose long sides extend in the front-and-back direction when viewed in the up-and-down direction. The second region A2 is located between the first region A1*a* and the first region A1*b*. The second region A2 has a rectangular or substantially rectangular shape whose long sides extend in the front-and-back direction when viewed in the up-and-down direction. The first region A1*a* and the second region A2 are adjacent to each other when viewed in the up-and-down direction. Likewise, the first region A1*b* and the second region A2 are adjacent to each other when viewed in the up-and-down direction.

The first regions A1*a* and A1*b* are somewhat large in size when viewed in the up-and-down direction. More specifically, the first regions A1*a* and A1*b* each have a shape that encompasses a circle whose diameter is equal to the minimum width of each of the connection conductor layers 27*a* and 27*b* in a cross section passing through the interlayer connection conductors v1 and v2 and extending in the up-and-down direction. That is, each of the first regions A1*a* and A1*b* is not a minute region that is unable to encompass a circle whose diameter is equal to the minimum width of each of the connection conductor layers 27*a* and 27*b* in a cross section passing through the interlayer connection conductors v1 and v2 and extending in the up-and-down direction.

The compression rate of the insulation layers 16*a* to 16*d* is higher in the first regions A1*a* and A1*b* than in the second region A2. Thus, the dimension of each of the insulation layers 16*a* to 16*d* (porous insulation layers) in the up-and-down direction is smaller in the first regions A1*a* and A1*b* than in the second region A2. That is, T1 is less than T2, where T1 denotes the thickness of each of the insulation layers 16*a* to 16*d* in the first regions A1*a* and A1*b*, and T2 denotes the thickness of each of the insulation layers 16*a* to 16*d* in the second region A2. Accordingly, the dimension of the multilayer body 12 in the up-and-down direction is smaller in the first regions A1*a* and A1*b* than in the second region A2. That is, T3 is less than T4, where T3 denotes the thickness of the multilayer body 12 in the first regions A1*a* and A1*b*, and T4 denotes the thickness of the multilayer body 12 in the second region A2. Structural features of the multilayer substrate 10 include (A) and (B), which will be described below.

(A) The average void size of the insulation layers 16*a* to 16*d* (porous insulation layers) is smaller in the first regions A1*a* and A1*b* than in the second region A2.

(B) The insulation layers 16*a* to 16*d* (porous insulation layers) are denser in the first regions A1*a* and A1*b* than in the second region A2.

The void size herein refers to the volume of voids. The volume of voids may be determined through analysis of a three-dimensional image obtained by scanning performed on the multilayer substrate 10 with a CT scanner. The region subject to measurement is a cube with six square surfaces each side of which is equal to the minimum dimension of the multilayer substrate 10 extending in the up-and-down direction, the left-and-right direction, and the front-and-back direction. The volume of voids in the region is measured. The through-holes where the via holes are provided are not hollow. The regions where the via holes are provided are not subject to the measurement of the volume of voids. The procedure for measuring the volume of voids may be adopted into the measurement of density.

The density of the insulation layers 16*a* to 16*d* refers to the per unit volume of the insulation layers 16*a* to 16*d*. The density of the insulation layers 16*a* to 16*d* is determined in the following way. The mass and volume of the insulation layers 16*a* to 16*d* are measured. The mass of the insulation layers 16*a* to 16*d* is then divided by the volume of the insulation layers 16*a* to 16*d*.

The size of voids in the insulation layers 16*a* to 16*d* and the density of the insulation layers 16*a* to 16*d* change continuously from the boundary between the first region A1*a* and the second region A2 and the boundary between the first region A1*a* and the second region A2. Referring to FIG. 2, changes in the size of voids and changes in the density of the insulation layers 16*a* to 16*d* are represented in terms of shades of gray. Structural features of the multilayer substrate 10 include (E) and (F), which will be described below.

(E) The voids in the insulation layers 16*a* to 16*d* (porous insulation layers) in the second region A2 decrease in size with increasing proximity to the boundary between the first region A1*a* and the second region A2 and the boundary between the first region A1*b* and the second region A2.

(F) The insulation layers 16*a* to 16*d* (porous insulation layers) in the second region A2 increase in density with increasing proximity to the boundary between the first region A1*a* and the second region A2 and the boundary between the first region A1*b* and the second region A2.

The interlayer connection conductors v1 are located in the first region A1*a* and each extend through the insulation layers 16*a* to 16*d* (porous insulation layers) in the up-and-down direction. The interlayer connection conductors v2 are located in the first region A1*b* and each extend through the insulation layers 16*a* to 16*d* (porous insulation layers) in the up-and-down direction.

Structure of Electronic Apparatus 1

Figure 3:
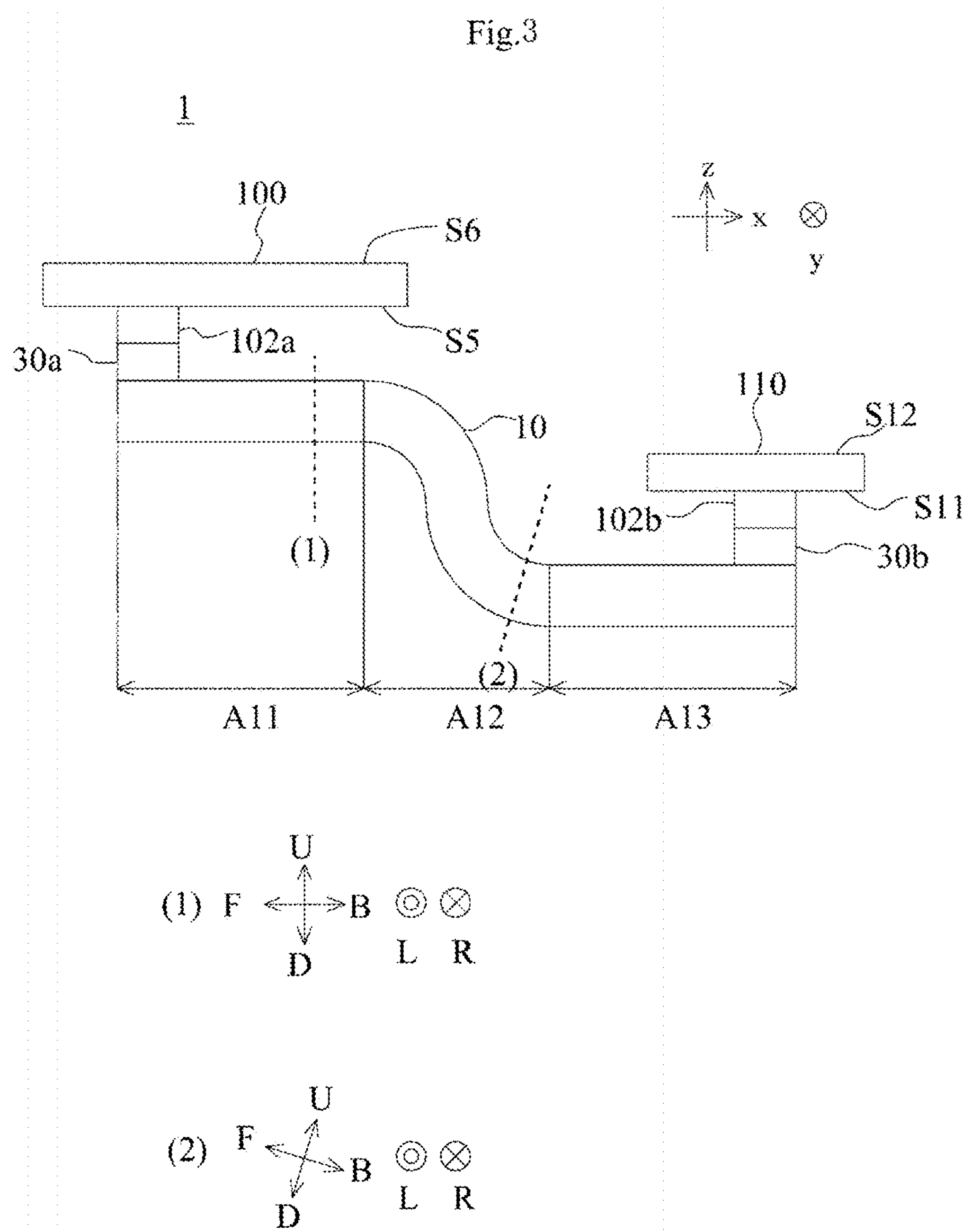
FIG. 3 is a left side view of a portion of the internal structure of an electronic apparatus 1 including the multilayer substrate 10.

The following describes the structure of an electronic apparatus 1 with reference to the accompanying drawings. The electronic apparatus 1 includes the multilayer substrate 10. FIG. 3 is a left side view of portion of the internal structure of the electronic apparatus 1 including the multilayer substrate 10. The electronic apparatus 1 may be a mobile wireless communication terminal. For example, the electronic apparatus 1 is a smartphone.

The multilayer substrate 10 is bent as illustrated in FIG. 3. This means that the multilayer substrate 10 is deformed and curved due to external forces exerted on the multilayer substrate 10. The multilayer substrate 10 may be bent in two different manners. One example is that the multilayer substrate 10 is bent by plastic deformation. When being bent by the application of heat, the multilayer substrate 10 is prone to plastic deformation. In this case, the insulation layers 16*a* to 16*d* are made of thermoplastic resin. In the other example, the multilayer substrate 10 is bent by elastic deformation.

The bent portion of the multilayer substrate 10 is hereinafter referred to as a first section A12. The radius of curvature of the other portion including second sections A11 and A13 is greater than the radius of curvature of the first section A12. That is, the second sections A11 and A13 of the multilayer substrate 10 may be slightly bent or may be unbent. The x axis, the y axis, and the z axis herein referred to in relation to the electronic apparatus 1 are defined as follows. With regard to the second section A11, the x axis, the y axis, and the z axis extend in the front-and-back direction, the left-and-right direction, and the up-and-down direction, respectively. The second section A11, the first section A12, and the second section A13 are arranged in sequence from the −x side toward the +x side.

As illustrated in FIG. 3, the first section A12 of the multilayer substrate 10 is bent in the z axis direction. With regard to the second section A11, the z axis direction is an upward direction or a downward direction. As can be seen in FIG. 3, the up-and-down direction and the front-and-down direction of one portion of the multilayer substrate 10 do not necessarily coincide with the respective directions in another portion of the multilayer substrate 10. The up-anddown direction and the front-and-back direction in the unbent portion of the multilayer substrate 10, namely, the second sections A11 and A13 (e.g., at the point marked with (1) in FIG. 3) coincide with the z axis direction and the x axis direction, respectively. The up-and-down direction and the front-and-back direction in the bent portion of the multilayer substrate 10, namely, the first section A12 (e.g., at the point marked with (2) in FIG. 3) do not coincide with the z axis direction and the x axis direction, respectively.

Referring to FIG. 3, the electronic apparatus 1 includes the multilayer substrate 10, connectors 30*a*, 30*b*, 102*a*, and 102*b*, and circuit boards 100 and 110.

The circuit boards 100 and 110 are plate-shaped. The circuit board 100 includes main surfaces S5 and S6. The main surface S5 is on the −z side with respect to the main surface S6. The circuit board 110 includes main surfaces S11 and S12. The main surface S11 is on the −z side with respect to the main surface S12. The circuit boards 100 and 110 each include wiring conductor layers, ground conductor layers, and electrodes (not illustrated).

The connectors 30*a* and 30*b* are mounted on one of the main surfaces of the multilayer body 12 or, more specifically, the main surface on the +z side (i.e., an upper main surface of the multilayer body 12) and are located on the second section A11 and the second section A13, respectively. The connector 30*a* is mounted on the signal terminal 28*a* and the first ground conductor layer 24, that is, on the exposed portions in the cavities h1 to h3. The connector 30*b* is mounted on the signal terminal 28*b* and the first ground conductor layer 24, that is, on the exposed portions in the cavities h4 to h6.

The connector 102*a* is mounted on the main surface S5 of the circuit board 100, and the connector 102*b* is mounted on the main surface S11 of the circuit board 110. The connectors 102*a* and 102*b* are connected to the connectors 30*a* and 30*b*, respectively. The circuit boards 100 and 110 are thus electrically connected to each other by the multilayer substrate 10.

Method for Manufacturing Multilayer Substrate 10

Figure 4:
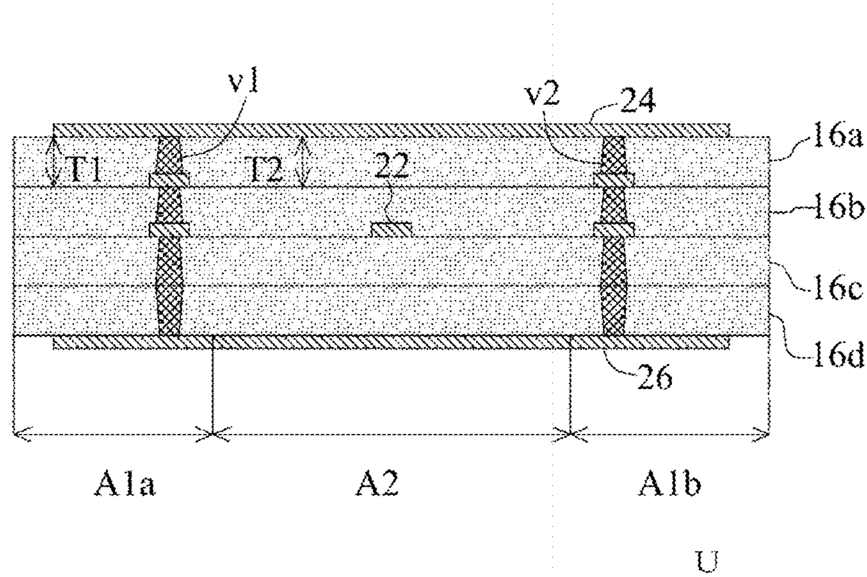
FIG. 4 is a sectional view of the multilayer substrate 10 in the process of being manufactured.
Figure 5:
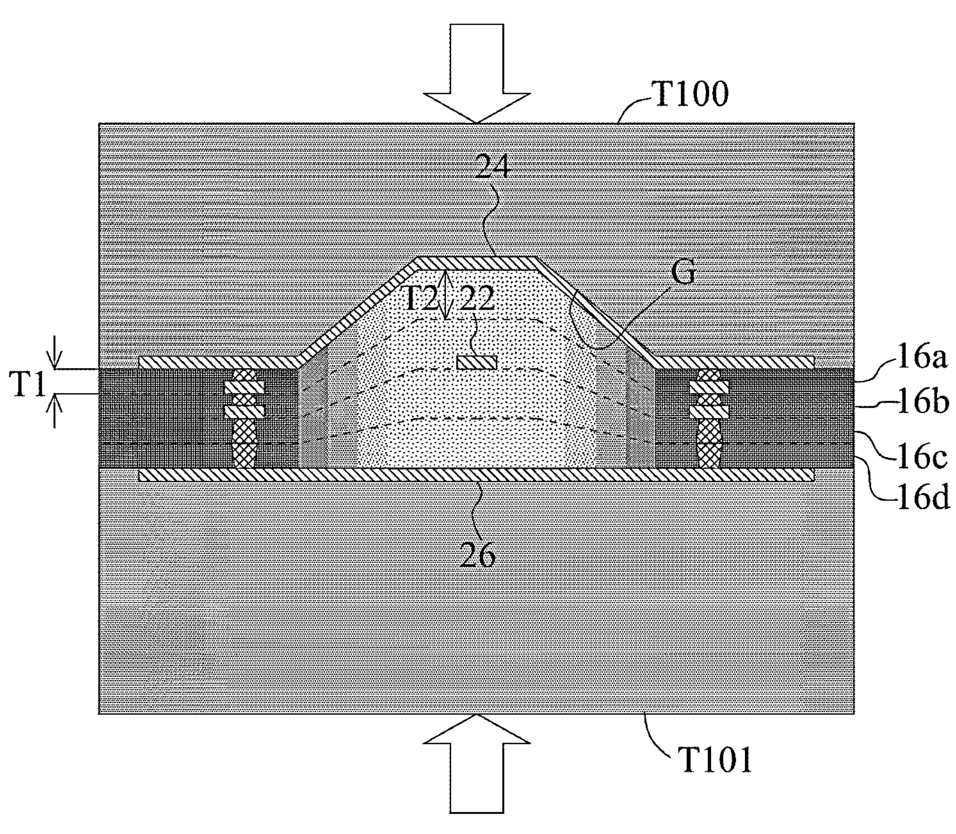
FIG. 5 is a sectional view of the multilayer substrate 10 in the process of being manufactured.

The following describes a non-limiting example of a method for manufacturing the multilayer substrate 10 with reference to the accompanying drawings. FIGS. 4 and 5 are sectional views of the multilayer substrate 10 in the process of being manufactured.

First, the first ground conductor layer 24, the signal terminals 28*a* and 28*b*, the signal conductor layer 22, the connection conductor layers 23*a*, 23*b*, 27*a*, 27*b*, 29*a*, and 29*b*, and the second ground conductor layer 26 are formed on the insulation layers 16*a* to 16*d* in the following manner. A conductor foil or, more specifically, a copper foil is stuck on the upper main surfaces or the lower main surfaces of the insulation layers 16*a*, 16*b*, and 16*d* and is then etched.

Subsequently, the interlayer connection conductors v1 to v4 are formed in the insulation layers 16*a* to 16*d* in the following manner. Through holes are formed in the insulation layers 16*a* to 16*d* and are then filled with a conductive paste.

Referring to FIG. 4 (illustrating a stacking step), the insulation layers 16*a* to 16*d* including porous insulation layers made of porous materials are stacked on top of one another in the up-and-down direction. In the stacking step, the thickness T1 of each of the insulation layers 16*a* to 16*d* in the first regions A1*a* and A1*b* is equal or substantially equal to the thickness T2 of each of the insulation layers 16*a* to 16*d* in the second region A2.

Referring to FIG. 5 (illustrating a pressing step), the insulation layers 16*a* to 16*d* are pressed. In the present preferred embodiment, the stacking step illustrated in FIG. 4 is followed by the pressing step, in which the insulation layers 16*a* to 16*d* are pressed in the following manner. More specifically, the insulation layers 16*a* to 16*d* are sandwiched by a die T100 and a die T10*l* in the up-and-down direction. The die T100 includes a lower surface with a groove G. The lower surface of the die T100 is recessed upward at the groove G. The die T10*l* includes a flat upper surface. The amount of pressure applied to a region in which the insulation layers 16*a* to 16*d* do not overlap the groove G in the up-and-down direction is greater than the amount of pressure applied to a region in which the insulation layers 16*a* to 16*d* overlap the groove G in the up-and-down direction. The compression rate in the region in which the insulation layers 16*a* to 16*d* do not overlap the groove G in the up-and-down direction is thus greater than the compression rate in the region in which the insulation layers 16*a* to 16*d* overlap the groove G in the up-and-down direction. The first regions A1*a* and A1*b* correspond to the region in which the insulation layers 16*a* to 16*d* do not overlap the groove G in the up-and-down direction. The second region A2 corresponds to the region in which the insulation layers 16*a* to 16*d* overlap the groove G in the up-and-down direction. Structural features of the multilayer substrate 10 obtained in the pressing step include (A) and/or (B). Thus, the dimension of each of the insulation layers 16*a* to 16*d* (porous insulation layers) in the up-and-down direction is smaller in the first regions A1*a* and A1*b* than in the second region A2. That is, T1 is less than T2, where T1 denotes the thickness of each of the insulation layers 16*a* to 16*d* in the first regions A1*a* and A1*b*, and T2 denotes the thickness of each of the insulation layers 16*a* to 16*d* in the second region A2.

The pressing step involves application of heat to the insulation layers 16*a* to 16*d*. The insulation layers 16*a* to 16*d* made of thermoplastic resin soften and melt by the application of heat. Accordingly, the insulation layers 16*a* to 16*d* are bonded together. The conductive paste is solidified through the application of heat and is thus formed into the interlayer connection conductors v1 to v4.

Lastly, the insulation layers 20*a* and 20*b* (see FIG. 2) are formed on the upper main surface of the insulation layer 16*a* and the lower main surface of the insulation layer 16*b*, respectively. The multilayer substrate 10 obtained by this process is in finished form.

Effects

The multilayer substrate 10 is provided as above, with a view toward a greater degree of flexibility in the design of the multilayer substrate 10. To be more specific, the dimension of each of the insulation layers 16*a* to 16*d* (porous insulation layers) in the up-and-down direction is smaller in the first regions A1*a* and A1*b* than in the second region A2. That is, T1 is less than T2, where T1 denotes the thickness of each of the insulation layers 16*a* to 16*d* in the first regions A1*a* and A1*b*, and T2 denotes the thickness of each of the insulation layers 16*a* to 16*d* in the second region A2. This means that structural features of the multilayer substrate 10 include (A) and (B).

With (A) and (B) being included in the structural features of the multilayer substrate 10, the physical properties of the first regions A1*a* and A1*b* are set apart from the physical properties of the second region A2. The difference in the physical properties may be used to provide a greater degree of flexibility in the design of the multilayer substrate 10 in various aspects.

For example, the dielectric constant and the dielectric dissipation factor are each lower in the second region A2 than in the first regions A1*a* and A1*b*. Thus, placing the signal conductor layer 22 in the second region A2 yields reductions in the dielectric constant and the dielectric dissipation factor in the region around the signal conductor layer 22. The dielectric loss in the signal conductor layer 22 may be reduced accordingly. The multilayer substrate 10 with low dielectric loss may be easily obtained. Accordingly, the flexibility in the design of the multilayer substrate 10 is enhanced.

The multilayer body 12 is more rigid in the first regions A1*a* and A1*b* than in the second region A2. This means that processibility of the multilayer body 12 in the first regions A1*a* and A1*b* is enhanced. The interlayer connection conductors v1 and v2 extending through the insulation layers 16*a* to 16*d* may thus be easily formed in the first regions A1*a* and A1*b*. The multilayer substrate 10 with ease of manufacturability is obtained. Accordingly, the flexibility in the design of the multilayer substrate 10 is enhanced.

The value of T3 denoting the dimension of the multilayer body 12 in the up-and-down direction in the first regions A1*a* and A1*b* may thus be set apart from the value of T4 denoting the dimension of the thickness of the multilayer body 12 in the up-and-down direction in the second region A2. In this way, the multilayer substrate 10 in process is shaped in conformity with the internal structure of the electronic apparatus 1. This permits placement of the multilayer substrate 10 in a variety of places. Accordingly, the flexibility in the design of the multilayer substrate 10 is enhanced.

There are less likely to be steep changes in the physical properties of the multilayer substrate 10. To be more specific, structural features of the multilayer substrate 10 include (E) and (F). For this reason, the changes in the dielectric constant, the dielectric dissipation factor, the rigidity, and other physical properties of the multilayer substrate 10 at the boundary between the first region A1*a* and the second region A2 and the boundary between the first region A1*b* and the second region A2 are not that steep.

First Modification

Figure 6:
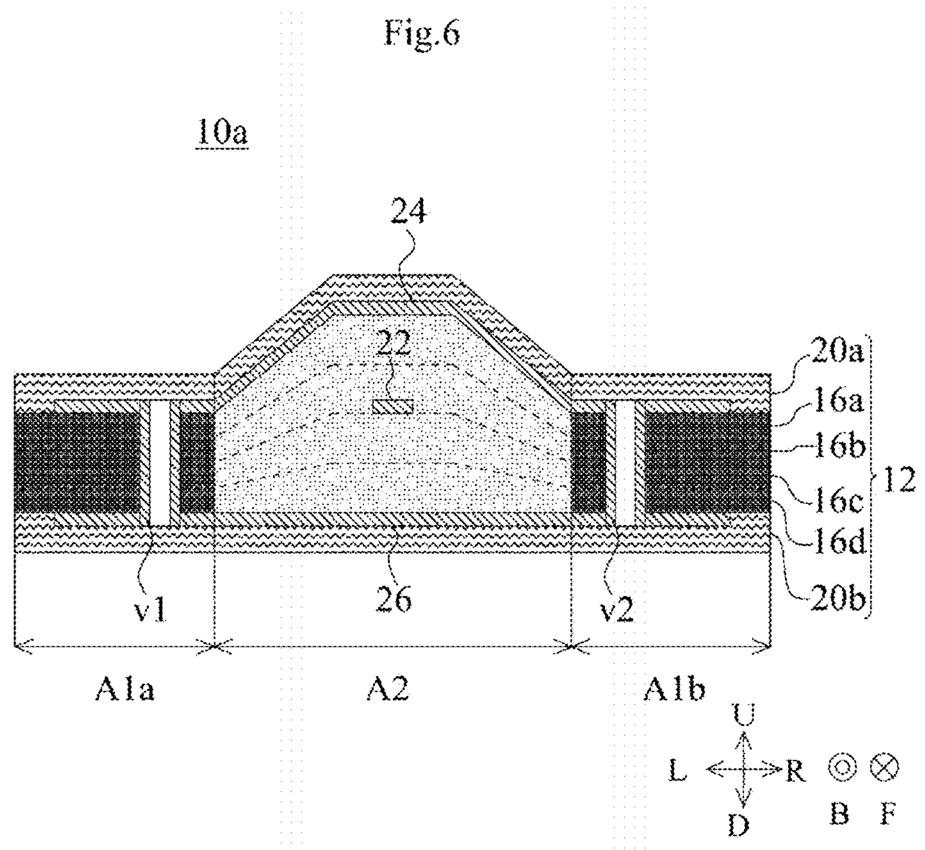
FIG. 6 is a sectional view of a multilayer substrate 10*a*.

The following describes a multilayer substrate 10*a* in a first modification with reference to FIG. 6, which is a sectional view of the multilayer substrate 10*a*.

The difference between the multilayer substrate 10 and the multilayer substrate 10*a* is in the structure of the interlayer connection conductors v1 to v4. To be more specific, the interlayer connection conductors v1 to v4 of the multilayer substrate 10*a* are through hole conductors. The through hole conductors are obtained by the application of plating to the through holes formed in the insulation layers 16*a* to 16*d*. The structure of the multilayer substrate 10*a* is otherwise similar to the structure of the multilayer substrate 10 and will not be further described. The effects produced by the multilayer substrate 10*a* may be comparable to those produced by the multilayer substrate 10. The interlayer connection conductors v1 and v2 are disposed in the multilayer body 12 in the first regions A1*a* and A1*b* of the multilayer substrate 10*a*. The plating solution applied to form the interlayer connection conductors v1 and v2 is thus less likely to spread out into the inner portion of the multilayer body 12.

Second Modification

Figure 7:
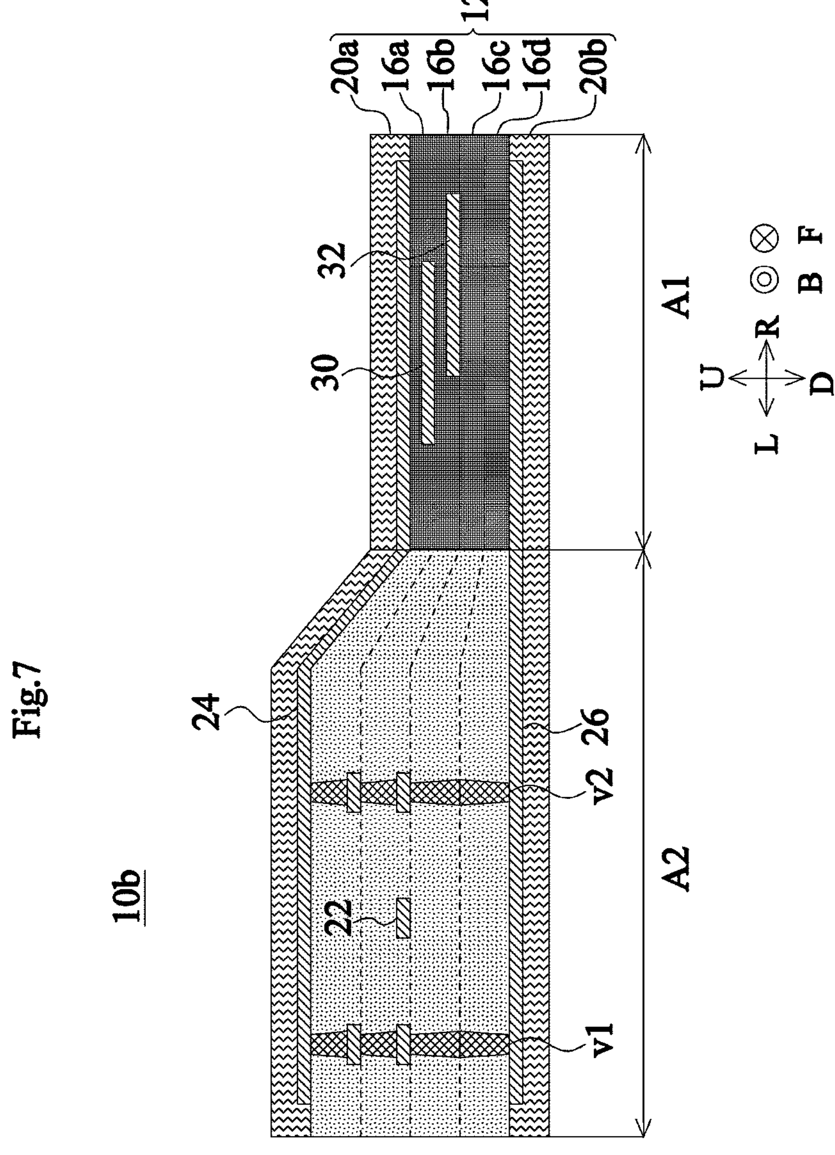
FIG. 7 is a sectional view of a multilayer substrate 10*b*.

The following describes a multilayer substrate 10*b* in a second modification with reference to FIG. 7, which is a sectional view of the multilayer substrate 10*b*. The multilayer substrate 10*b* is similar to the multilayer substrate 10 in the following respect: the size of voids in the insulation layers 16*a* to 16*d* and the density of the insulation layers 16*a* to 16*d* change continuously from the boundary between the first region A1*a* and the second region A2 and the boundary between the first region A1*a* and the second region A2. Note that changes in the size of voids and changes in the insulation layers 16*a* to 16*d* are not necessarily represented in terms of shades of gray in FIGS. 7 to 39.

The multilayer substrate 10*b* differs from the multilayer substrate 10 in that: (1) the multilayer substrate 10*b* includes a first region A1 in place of the first regions A1*a* and A1*b*; and (2) the multilayer substrate 10 includes a first capacitor conductor layer 30 and a second capacitor conductor layer 32.

To be more specific, the first region A1 is located on the right side of the second region A2. The signal conductor layer 22 and the interlayer connection conductors v1 and v2 are located in the second region A2.

The first capacitor conductor layer 30 is disposed the multilayer body 12 in the first region A1. The first capacitor conductor layer 30 in the second modification is disposed on the upper main surface of the insulation layer 16*b* in the first region A1. The second capacitor conductor layer 32 is disposed in the multilayer body 12 in the first region A1. The second capacitor conductor layer 32 in the second modification is disposed on the upper main surface of the insulation layer 16*c* in the first region A1. The second capacitor conductor layer 32 overlaps the first capacitor conductor layer 30 when viewed in the up-and-down direction. This means that the insulation layer 16*b* (porous insulation layer) is located between the first capacitor conductor layer 30 and the second capacitor conductor layer 32. Thus, the first capacitor conductor layer 30 and the second capacitor conductor layer 32 define a capacitor. The structure of the multilayer substrate 10*b* is otherwise similar to the structure of the multilayer substrate 10 and will not be further described.

The effects produced by the multilayer substrate 10*b* may be comparable to those produced by the multilayer substrate 10. Furthermore, the multilayer substrate 10*b* includes a large-capacitance capacitor. To be more specific, the first capacitor conductor layer 30 and the second capacitor conductor layer 32 are located in the first region A1. The thickness T1 of each of the insulation layers 16*a* to 16*d* in the first regions A1 is less than the thickness T2 of each of the insulation layers 16*a* to 16*d* in the second region A2. This means that the first capacitor conductor layer 30 and the second capacitor conductor layer 32 are in close proximity to each other, thus defining a large-capacitance capacitor.

Structural features of the multilayer substrate 10*b* include (A) and (B), in which case the insulation layer 16*b* between the first capacitor conductor layer 30 and the second capacitor conductor layer 32 has a high dielectric constant. In this respect as well, the first capacitor conductor layer 30 and the second capacitor conductor layer 32 define a large-capacitance capacitor.

Third Modification

Figure 8:
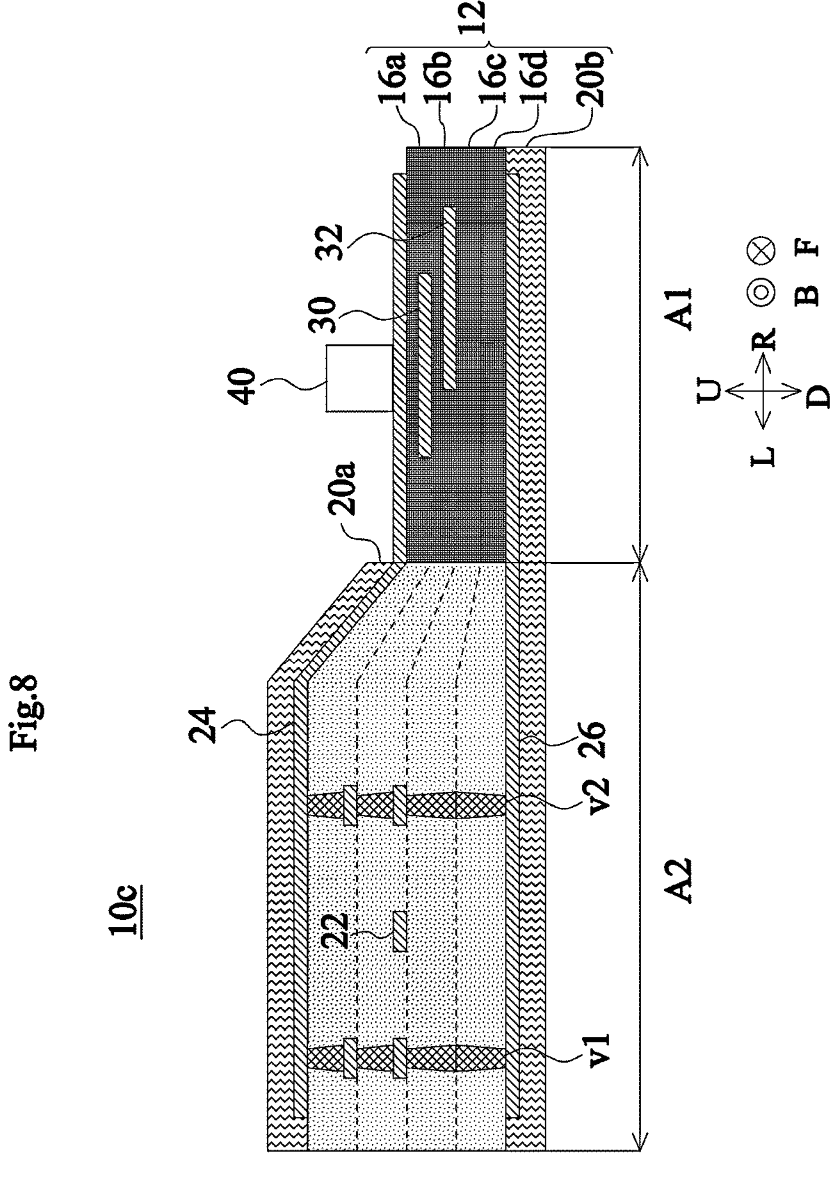
FIG. 8 is a sectional view of a multilayer substrate 10*c*.

The following describes a multilayer substrate 10*c* in a third modification with reference to FIG. 8, which is a sectional view of the multilayer substrate 10*c*.

The multilayer substrate 10*c* differs from the multilayer substrate 10*b* in that the multilayer substrate 10*c* includes a component 40. The component 40 is an electronic component in chip form, an integrated circuit (IC) device, or any other electronic component, such as a connector. The electronic component in chip form may be a capacitor or an inductor. The component 40 is mounted on the upper main surface or the lower main surface of the multilayer body 12 in the first region A1. The component 40 in the third modification is mounted on the upper main surface of the multilayer body 12 in the first region A1. The structure of the multilayer substrate 10*c* is otherwise similar to the structure of the multilayer substrate 10*b* and will not be further described.

The effects produced by the multilayer substrate 10*c* may be comparable to those produced by the multilayer substrate 10*b*. The multilayer body 12 of the multilayer substrate 10*c* is more rigid in the first region A1 than in the second region A2. This provides the ease of the mounting of the component 40 in the first region A1. The dimension of the first region A1 in the up-and-down direction is small. The first region A1 serving as the mounting region of the component 40 thus contributes to the reduction in the dimension of the multilayer substrate 10*c* in the up-and-down direction.

Fourth Modification

Figure 9:
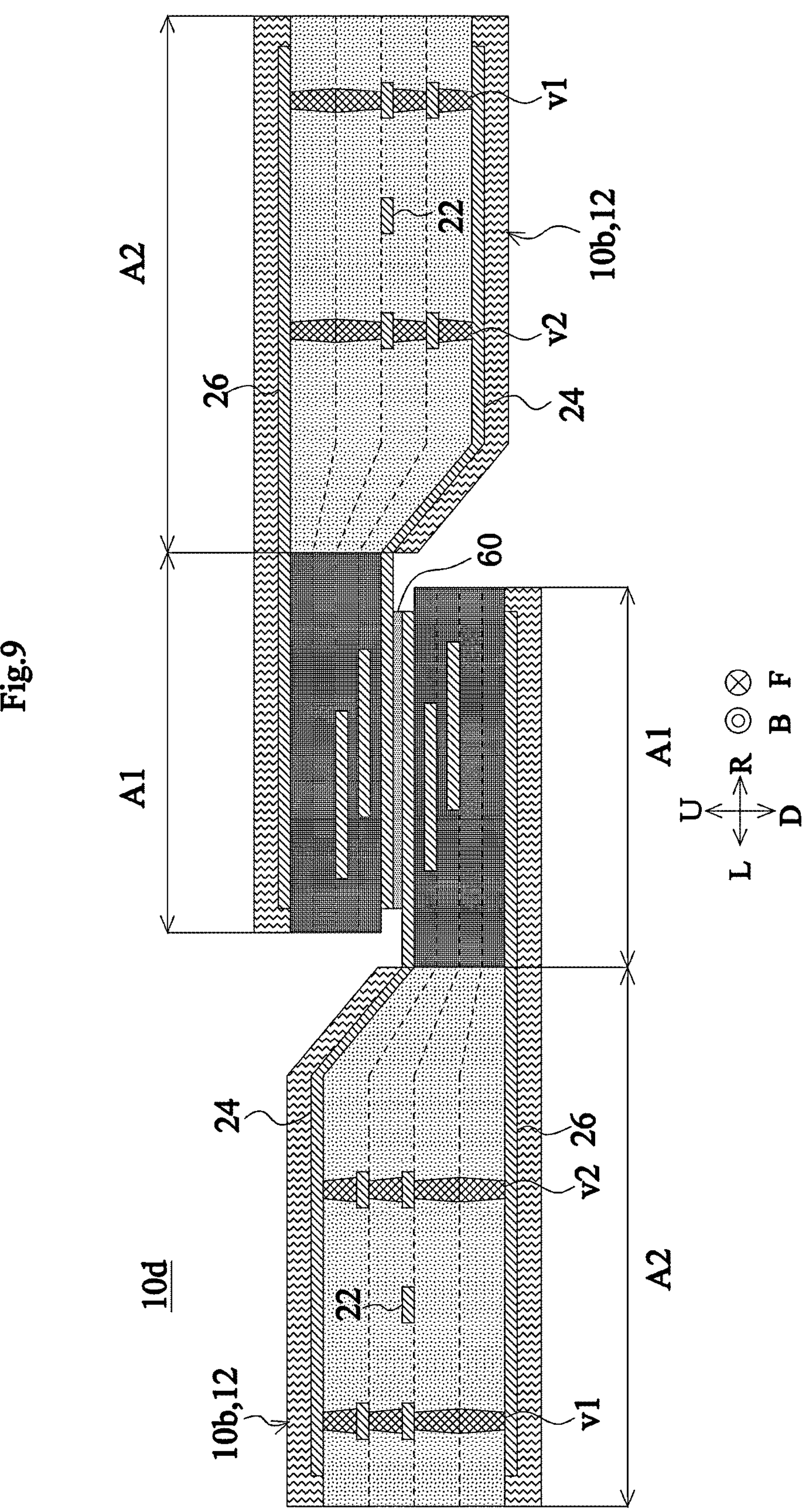
FIG. 9 is a sectional view of a multilayer substrate 10*d*.

The following describes a multilayer substrate 10*d* in a fourth modification with reference to FIG. 9, which is a sectional view of the multilayer substrate 10*d*.

The multilayer substrate 10*d* is a combination of two multilayer substrates 10*b* bonded together in the first region A1, in which the insulation layers 20*a* of the multilayer substrates 10*b* are eliminated. In the first region A1, the first ground conductor layers 24 of the multilayer substrates 10*b* are exposed to view. The two first ground conductor layers 24 are bonded to each other with solder 60 therebetween.

The ease of bonding the two multilayer substrates 10*b* to define the multilayer substrate 10*d* is attributable to the following factors. The multilayer bodies 12 of the multilayer substrates 10*b* are more rigid in the first region A1 than in the second region A2. Bonding the two multilayer substrates 10*b* to each other in the first region A1 eliminates or reduces the possibility of deformation of the multilayer substrates 10*b* in the bonding process. The two multilayer substrates 10*b* may thus be easily bonded to each other to define the multilayer substrate 10*d*. With the multilayer bodies 12 being reduced in thickness in the first region A1, the dimension of the multilayer substrate 10*d* in the up-and-down direction is reduced in the region where the multilayer substrates 10*b* are bonded to each other.

It is required that the insulation layers 20*a* of the multilayer substrates 10*b* be at least partially eliminated from the first region A1.

Fifth Modification

Figure 10:
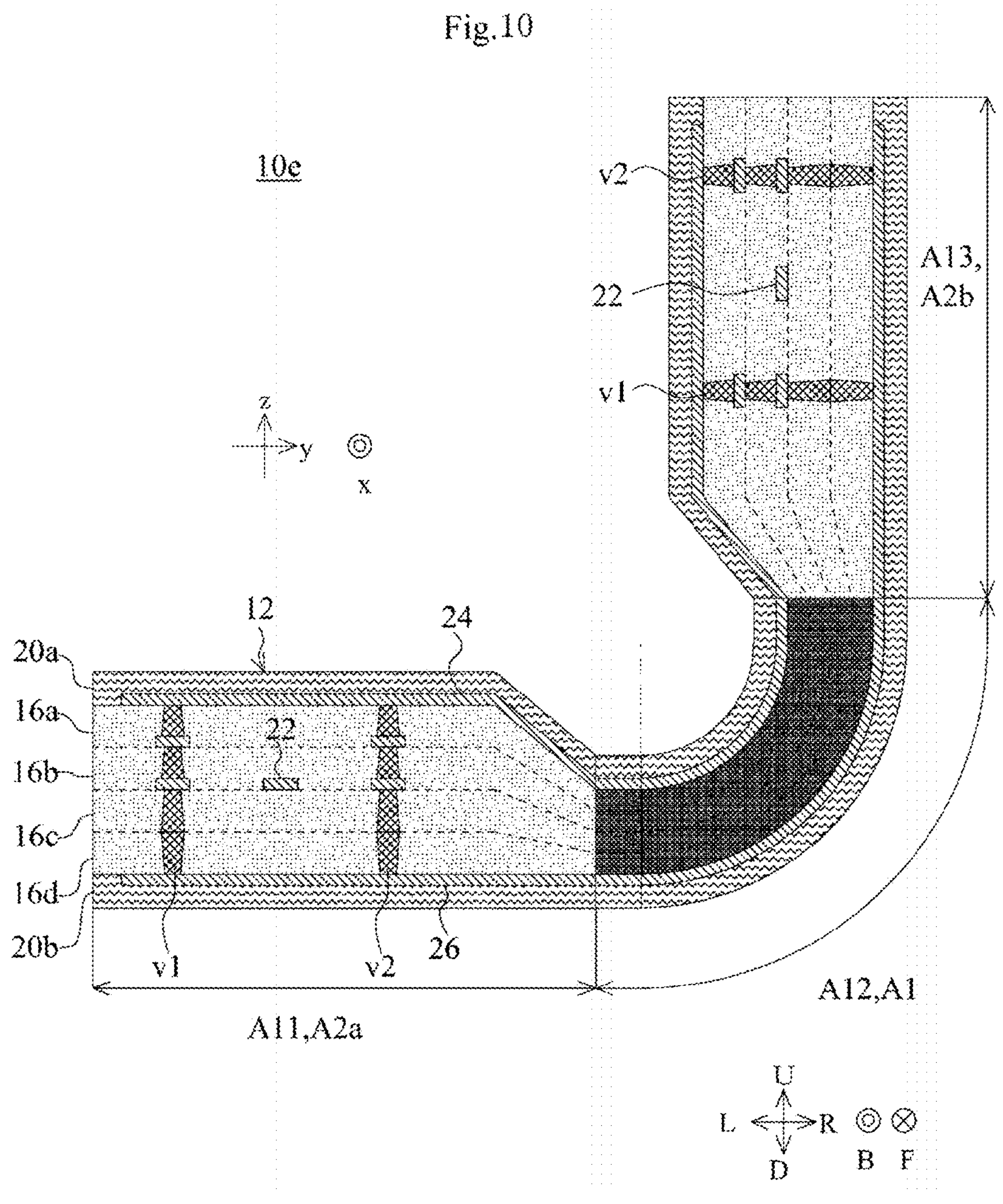
FIG. 10 is a sectional view of a multilayer substrate 10*e*.

The following describes a multilayer substrate 10*e* in a fifth modification with reference to FIG. 10, which is a sectional view of the multilayer substrate 10*e*.

The multilayer substrate 10*e* differs from the multilayer substrate 10*b* in that the multilayer substrate 10*e* includes a first section located in the first region A1. The first section is denoted by A12. The multilayer substrate 10*e* includes second sections as well as the first section A12. The second sections are denoted by A11 and A13, respectively. The second section A11 is on the −y side with respect to the first section A12. The second section A11 is located in a second region A2*a*. The second section A13 is on the +z side with respect to the first section A12. The second section A13 is located in a second region A2*b*. The second region A2*b* is structurally identical to the second region A2*a*. The first section A12 is located in the first region A1. The structure of the multilayer substrate 10*e* is otherwise similar to the structure of the multilayer substrate 10*b* and will not be further described.

The effects produced by the multilayer substrate 10*e* may be comparable to those produced by the multilayer substrate 10*b*. Furthermore, the first section A12 of the multilayer substrate 10*e* can be easily bent because the dimension of the multilayer body 12 in the up-and-down direction is reduced in the first section A12 of the multilayer substrate 10*e*. Another advantage of the fact that the dimension of the multilayer body 12 in the up-and-down direction is reduced in the first section A12 of the multilayer substrate 10*e* is that the dimension of the multilayer body 12 in the up-and-down direction does not change much in the first section A12 when the first section A12 of the multilayer substrate 10*e* is bent. Thus, the bending of the first section A12 of the multilayer substrate 10*e* is less likely to cause changes in the electrical characteristics of the multilayer substrate 10*e*. The electrical characteristics herein refer to the capacitance value, the characteristic impedance, the resonant frequency, and the like.

Sixth Modification

Figure 11:
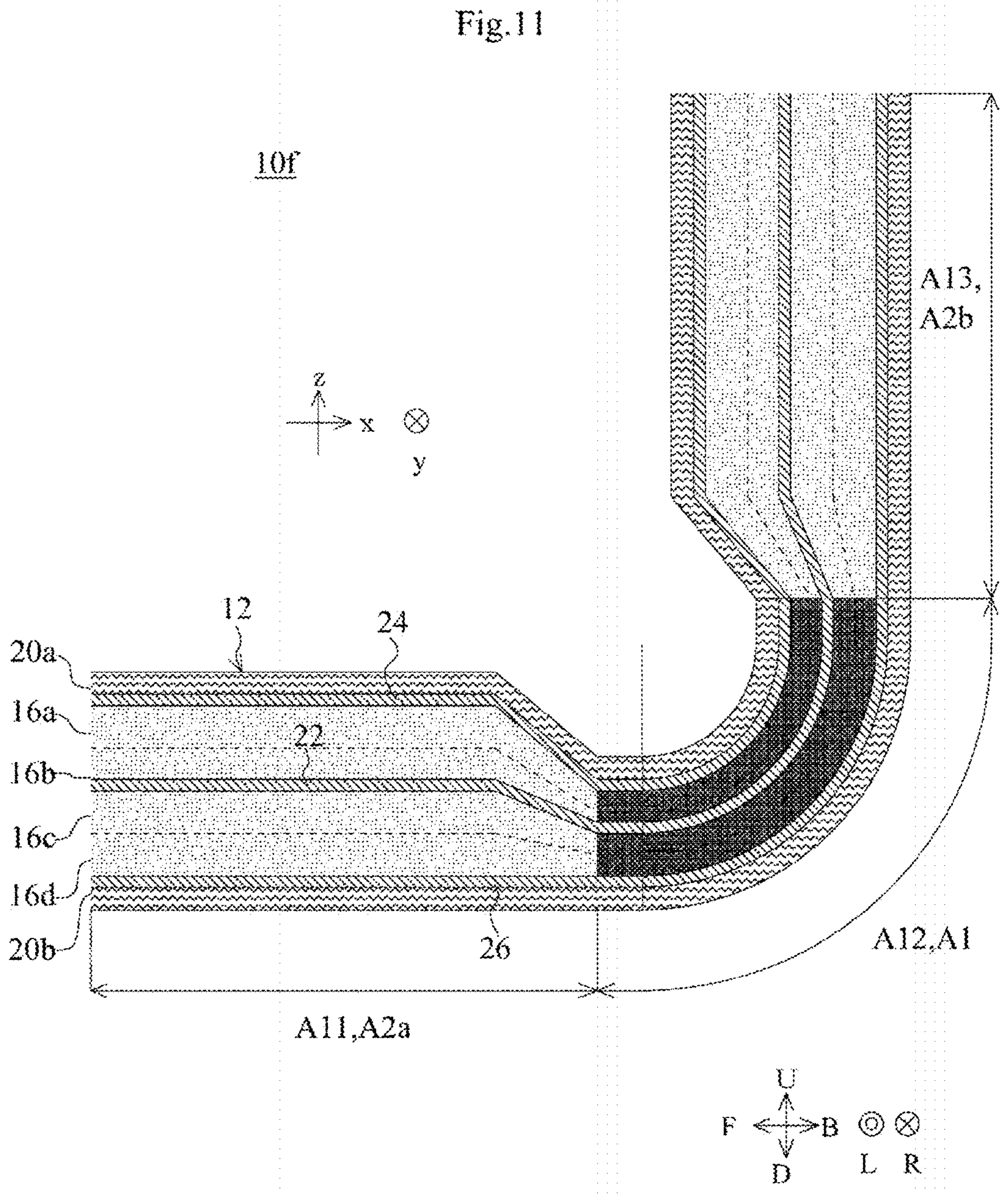
FIG. 11 is a sectional view of a multilayer substrate 10*f*.

The following describes a multilayer substrate 10*f* in a sixth modification with reference to FIG. 11, which is a sectional view of the multilayer substrate 10*f*.

The multilayer substrate 10*f* differs from the multilayer substrate 10*e* in that the signal conductor layer 22 of the multilayer substrate 10*f* extends across the second section A11, the first section A12, and the second section A13. The structure of the multilayer substrate 10*f* is otherwise similar to the structure of the multilayer substrate 10*e* and will not be further described. The multilayer body 12 of the multilayer substrate 10*f* is compressed more in the first region A1 than in the second regions A2*a* and A2*b* before the first section A12 of the multilayer substrate 10*f* is bent.

The effects produced by the multilayer substrate 10*f* may be comparable to those produced by the multilayer substrate 10*e*. The dimension of the multilayer body 12 in the up-and-down direction is reduced in the first section A12 of the multilayer substrate 10*f*. For this reason, the dimension of the multilayer body 12 in the up-and-down direction does not change much in the first section A12 when the first section A12 of the multilayer substrate 10*f* is bent. This eliminates or reduces the possibility that the characteristic impedance of the signal conductor layer 22 in the first section A12 will deviate from a predetermined value.

The line width of the signal conductor layer 22 of the multilayer substrate 10*f* may be reduced in the first section A12 in accordance with the thickness and the dielectric constant of the first section A12 so that the signal conductor layer 22 has the same characteristic impedance in both the first section A12 and the second section A11. Furthermore, the line width of the signal conductor layer 22 may decrease at and around the boundary between the second section A11 and the first section A12. That is, the signal conductor layer 22 in the second section A11 may decrease in width with increasing proximity to the first section A12.

Seventh Modification

Figure 12:
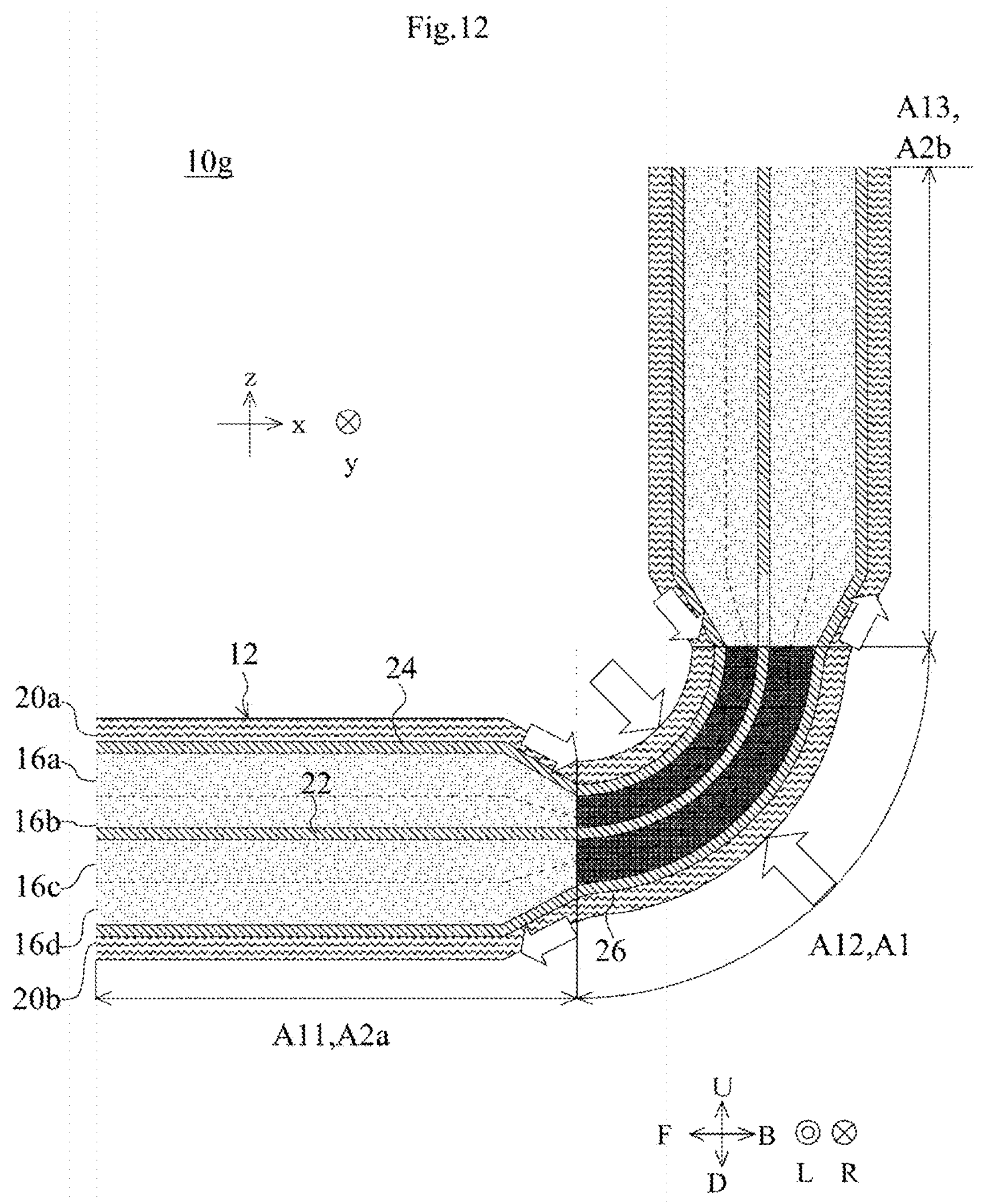
FIG. 12 is a sectional view of a multilayer substrate 10*g*.

The following describes a multilayer substrate 10*g* in a seventh modification with reference to FIG. 12, which is a sectional view of the multilayer substrate 10*g*.

The difference between the multilayer substrate 10*f* and the multilayer substrate 10*g* is in the manufacturing method. To be more specific, the multilayer body 12 of the multilayer substrate 10*f* is compressed more in the first region A1 than in the second regions A2*a* and A2*b* before the first section A12 of the multilayer substrate 10*f* is bent. Meanwhile, the first section A12 of the multilayer substrate 10*g* is bent with the multilayer body 12 not being compressed more in the first region A1 than in the second regions A2*a* and A2*b*. When the first section A12 of the multilayer substrate 10*g* is bent, the inner peripheral portion of the multilayer body 12 in the first section A12 is compressed, and the outer peripheral portion of the multilayer body 12 in the first section A12 is extended.

With the insulation layers 16*a* to 16*d* being under the stress caused by the bending of the first section A12, the dimension of each of the insulation layers 16*a* to 16*d* (porous insulation layers) in the up-and-down direction is smaller in the first region A1 than in the second regions A2*a* and A2*b*. That is, T1 is less than T2, where T1 denotes the thickness of each of the insulation layers 16*a* to 16*d* in the first region A1, and T2 denotes the thickness of each of the insulation layers 16*a* to 16*d* in the second regions A2*a* and A2*b*. The average void size of the insulation layers 16*a* to 16*d* (porous insulation layers) under the stress caused by the bending of the first section A12 of the multilayer substrate 10*g* is smaller in the first region A1 than in the second regions A2*a* and A2*b*. The insulation layers 16*a* to 16*d* (porous insulation layers) under the stress caused by the bending of the first section A12 of the multilayer substrate 10*g* is denser in the first region A1 than in the second regions A2*a* and A2*b*. In the first section A12, the multilayer body 12 is compressed in the up-and-down direction, as mentioned above. The structure of the multilayer substrate 10*g* is otherwise similar to the structure of the multilayer substrate 10*f* and will not be further described. The effects produced by the multilayer substrate 10*g* may be comparable to those produced by the multilayer substrate 10*f*. The first region A1 of the multilayer substrate 10*g* is formed while the multilayer substrate 10*g* is bent. The multilayer body 12 in the first section A12 of the multilayer substrate 10*g* is compressed. That is, a small portion of the multilayer body 12 is compressed. This means that the multilayer body 12 can be compressed with little degradation of the electrical characteristics.

Eighth Modification

Figure 13:
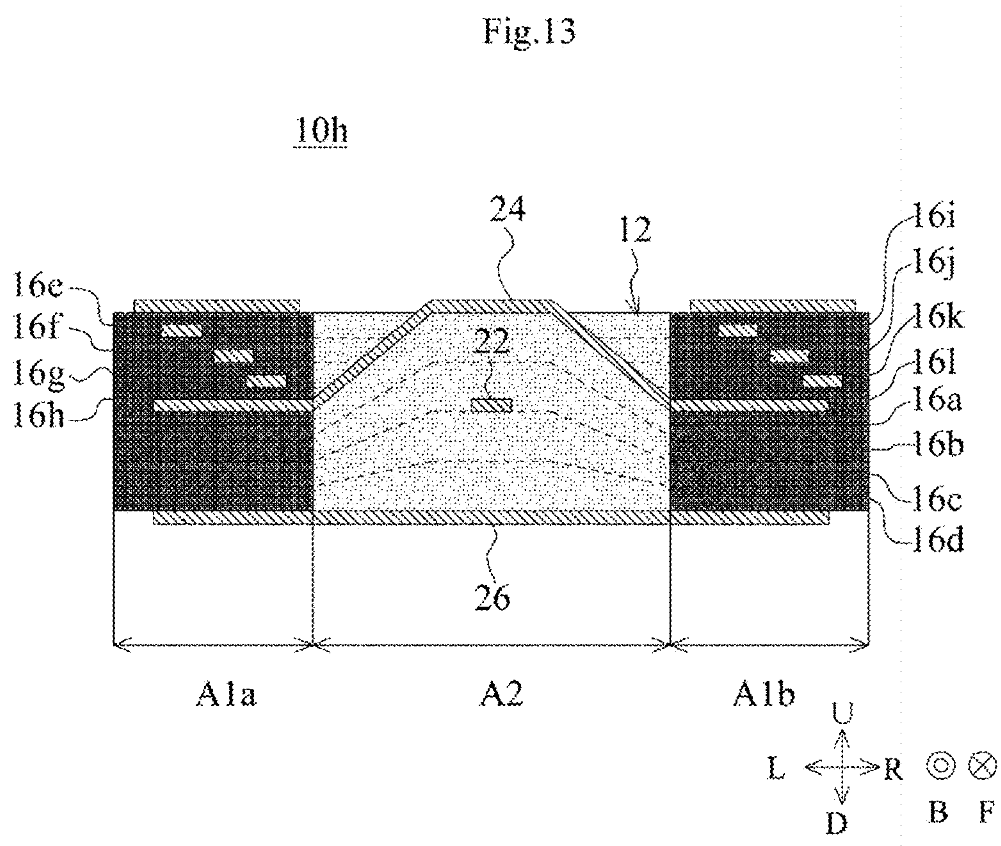
FIG. 13 is a sectional view of a multilayer substrate 10*h*.
Figure 14:
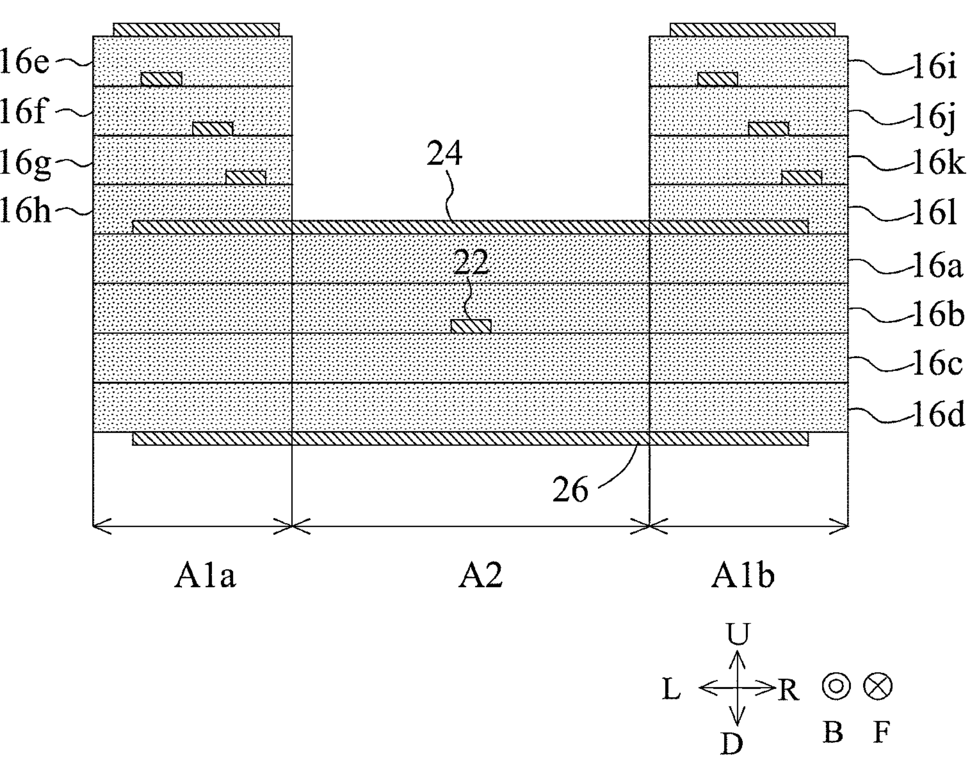
FIG. 14 is a sectional view of the multilayer substrate 10*h* in the process of being manufactured.

The following describes a multilayer substrate 10*h* in an eighth modification with reference to FIGS. 13 and 14, which are sectional views of the multilayer substrate 10*h*. FIG. 14 illustrates the multilayer substrate 10*h* in the process of being manufactured.

The multilayer substrate 10*h* differs from the multilayer substrate 10 in that the insulation layers in each of the first regions A1*a* and A1*b* is greater in number than the insulation layers in the second region A2. Referring to FIG. 13, the multilayer substrate 10*h* includes additional porous insulation layers, which are hereinafter referred to as insulation layers 16*e* to 16*l*. The insulation layers 16*e* to 16*h* are stacked on top of one another in the up-and-down direction. The insulation layers 16*e* to 16*h* are arranged in the stated order from top to bottom. The insulation layers 16*e* to 16*h* are disposed on the insulation layer 16*a* in the first region A1*a*. The insulation layers 16*i* to 16*l* are stacked on top of one another in the up-and-down direction. The insulation layers 16*i* to 16*l* are arranged in the stated order from top to bottom. The insulation layers 16*i* to 16*l* are disposed on the insulation layer 16*a* in the first region A1*b*.

The average void size of the insulation layers 16*e* to 16*l* is smaller than the average void size of the insulation layers 16*a* to 16*d* in the second region A2. The insulation layers 16*e* to 16*l* are denser than the insulation layers 16*a* to 16*d* in the second region A2.

The multilayer substrate 10*h* is manufactured in the following manner. The insulation layers 16*e* to 16*h* are arranged in a stacked on the insulation layer 16*a* in the first region A1*a*. The insulation layers 16*i* to 16*l* are arranged in a stack on the insulation layer 16*a* in the first region A1*b*. Subsequently, the insulation layers 16*a* to 16*l* are pressed in the up-and-down direction. The stacks in the first regions A1*a* and A1*b* where the insulation layers 16*a* to 16*l* are stacked on top of one another in the up-and-down direction are each thicker than the stack in the second region A2 where the insulation layers 16*a* to 16*d* are stacked on top of one another in the up-and-down direction. When dies each having a flat surface are pressed against the upper main surface and the lower main surface, respectively, of the multilayer body 12, the rate at which the insulation layers 16*a* to 16*l* in the first regions A1*a* and A1*b* are compressed in the up-and-down direction is higher than the rate at which the insulation layers 16*a* to 16*d* in the second region A2 are compressed in the up-and-down direction. As a result, the upper main surface and the lower main surface of the multilayer body 12 are flattened out. The average void size of the insulation layers 16*a* to 16*d* (porous insulation layers) is smaller in the first regions A1*a* and A1*b* than in the second region A2. The insulation layers 16*a* to 16*d* (porous insulation layers) are denser in the first regions A1*a* and A1*b* than in the second region A2. The average void size of the insulation layers 16*e* to 16*h* is smaller than the average void size of the insulation layers 16*a* to 16*d* in the second region A2. The insulation layers 16*e* to 16*h* are denser than the insulation layers 16*a* to 16*d* in the second region A2.

The effects produced by the multilayer substrate 10*h* may be comparable to those produced by the multilayer substrate 10. Furthermore, circuits may be formed on the insulation layers 16*e* to 16*l* of the multilayer substrate 10*h*. Accordingly, the flexibility in the design of the multilayer substrate 10*h* is enhanced. Many conductor layers in the first region A1*a* and A1*b* of the multilayer substrate 10*h* may be incorporated into the multilayer body 12 having a flat main surface. Interlayer connection conductors may be provided in the multilayer body 12 in the first regions A1*a* and A1*b* of the multilayer substrate 10*h*.

Ninth Modification

Figure 15:
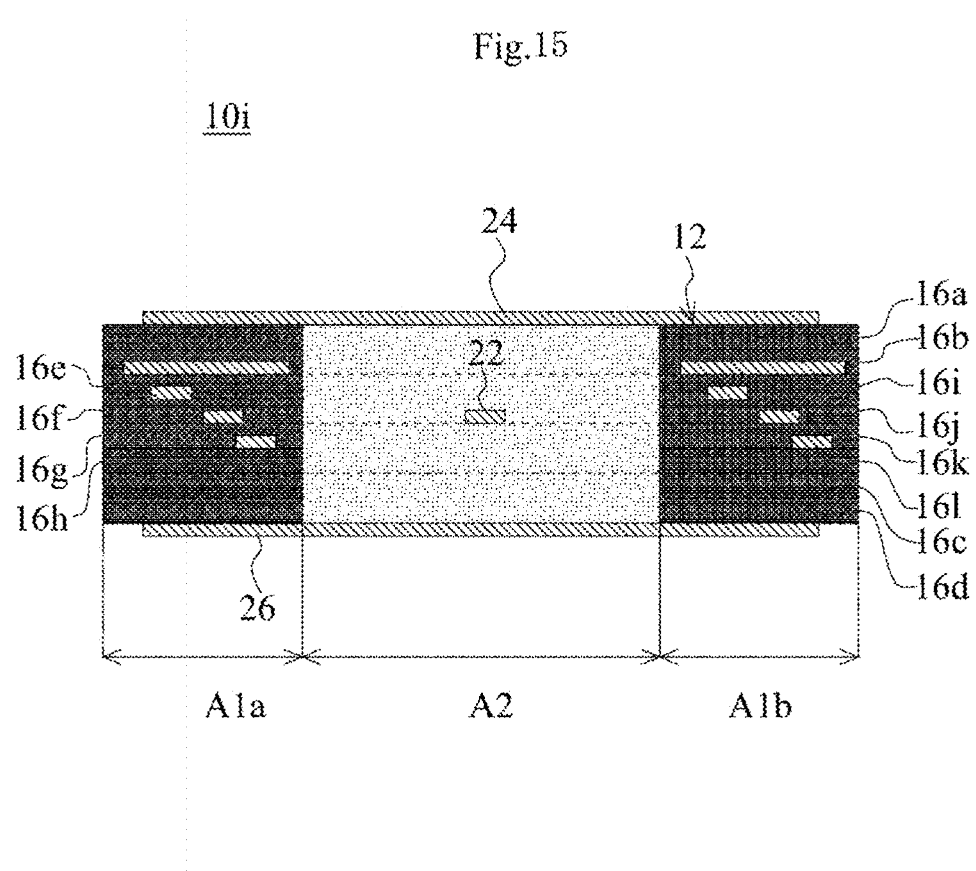
FIG. 15 is a sectional view of a multilayer substrate 10*i*.
Figure 16:
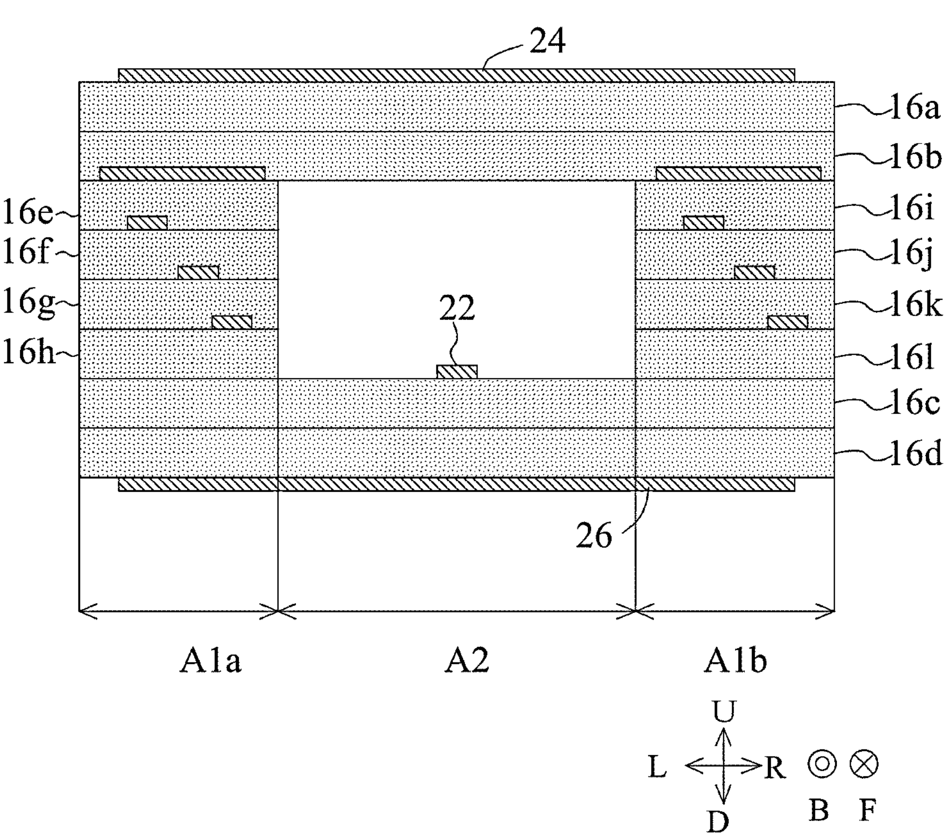
FIG. 16 is a sectional view of the multilayer substrate 10*i* in the process of being manufactured.

The following describes a multilayer substrate 10*i* in a ninth modification with reference to FIGS. 15 and 16, which are sectional views of the multilayer substrate 10*i*. FIG. 16 illustrates the multilayer substrate 10*i* in the process of being manufactured.

The difference between the multilayer substrate 10*h* and the multilayer substrate 10*i* is in the positions of the insulation layers 16*e* to 16*l*. The insulation layers 16*e* to 16*h* are located between the insulation layer 16*b* and the insulation layer 16*c* in the first region A1*a*. The insulation layers 16*i* to 16*l* are located between the insulation layer 16*b* and the insulation layer 16*c* in the first region A1*b*. The structure of the multilayer substrate 10*i* is otherwise similar to the structure of the multilayer substrate 10*h* and will not be further described. The effects produced by the multilayer substrate 10*i* may be comparable to those produced by the multilayer substrate 10*h*. The upper main surface of the multilayer body 12 of the multilayer substrate 10*i* is the upper main surface of the insulation layer 16*a*. The lower main surface of the multilayer body 12 of the multilayer substrate 10*i* is the lower main surface of the insulation layer 16*d*. Thus, the upper main surface and the lower main surface of the multilayer body 12 can be more stepless.

Tenth Modification

Figure 17:
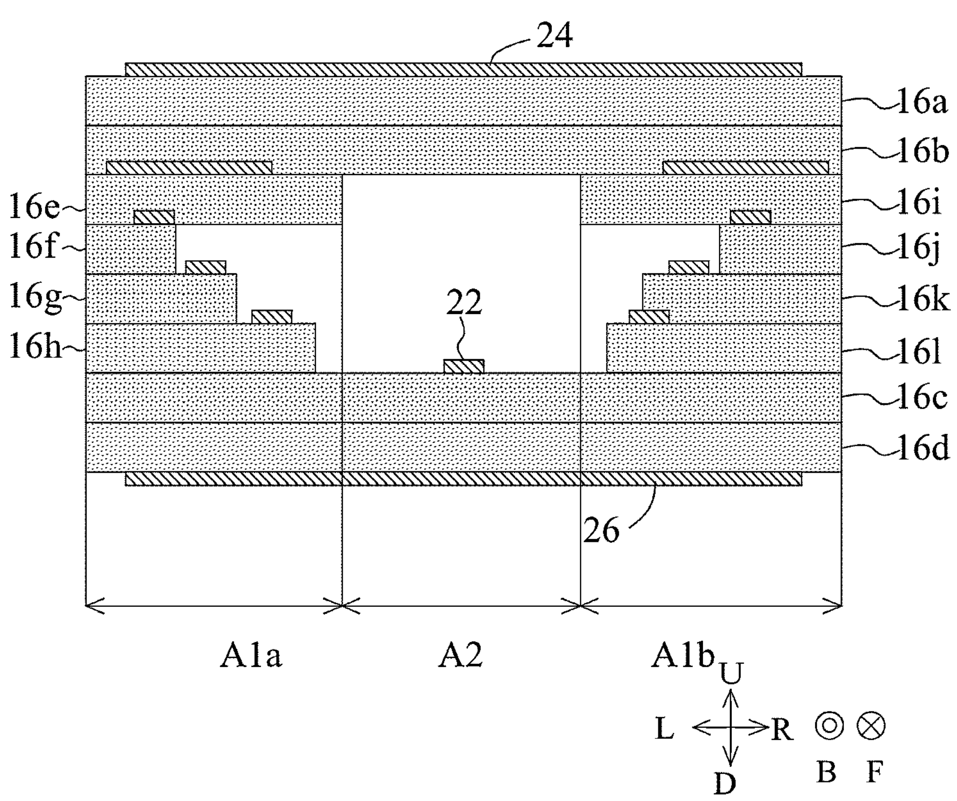
FIG. 17 is a sectional view of the multilayer substrate 10*j* in the process of being manufactured.
Figure 18:
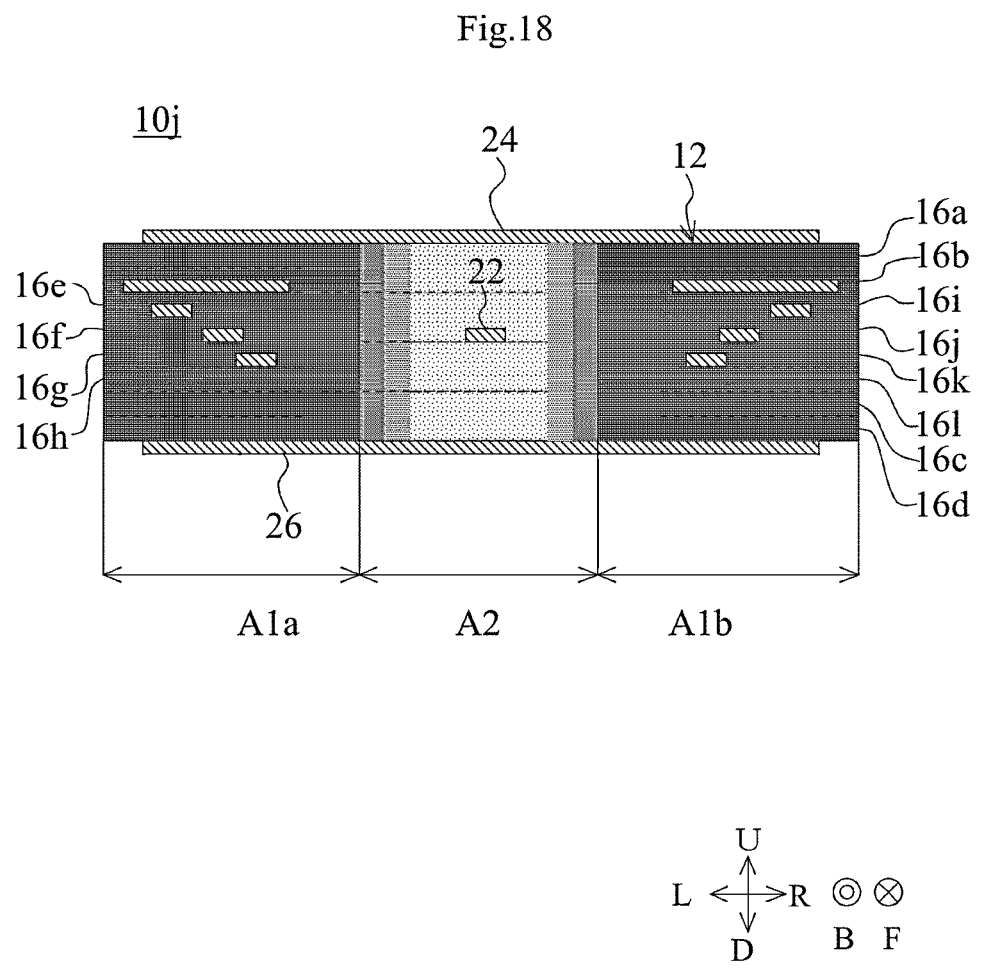

The following describes a multilayer substrate 10*j* in a tenth modification with reference to FIGS. 17 and 18, which are sectional views of the multilayer substrate 10*j*. FIG. 18 illustrates the multilayer substrate 10*j* in the process of being manufactured.

The difference between the multilayer substrate 10*i* and the multilayer substrate 10*j* is in the shapes of the insulation layers 16*e* to 16*l* in the state preceding the pressing step. This can be seen in FIG. 17. The right end of the insulation layer 16*h* is located on the right side with respect to the right end of the insulation layer 16*g*. The right end of the insulation layer 16*g* is located on the right side with respect to the right end of the insulation layer 16*f*. The left end of the insulation layer 16*l* is located on the left side with respect to the left end of the insulation layer 16*k*. The left end of the insulation layer 16*k* is located on the left side with respect to the left end of the insulation layer 16*j*. In this state, the insulation layers 16*a* to 16*l* are pressed in the up-and-down direction. As can be seen in FIG. 18, the voids in the insulation layers 16*a* to 16*d* (porous insulation layers) in the second region A2 decrease in size with increasing proximity to the boundary between the first region A1*a* and the second region A2 and the boundary between the first region A1*b* and the second region A2. The insulation layers 16*a* to 16*d* (porous insulation layers) in the second region A2 increase in density with increasing proximity to the boundary between the first region A1*a* and the second region A2 and the boundary between the first region A1*b* and the second region A2. The structure of the multilayer substrate 10*j* is otherwise similar to the structure of the multilayer substrate 10*i* and will not be further described.

The effects produced by the multilayer substrate 10*j* may be comparable to those produced by the multilayer substrate 10*i*. Furthermore, the changes in the dielectric constant, the dielectric dissipation factor, the rigidity, and other physical properties of the multilayer substrate 10*j* at the boundary between the first region A1*a* and the second region A2 and the boundary between the first region A1*b* and the second region A2 are not that steep.

Eleventh Modification

Figure 19:
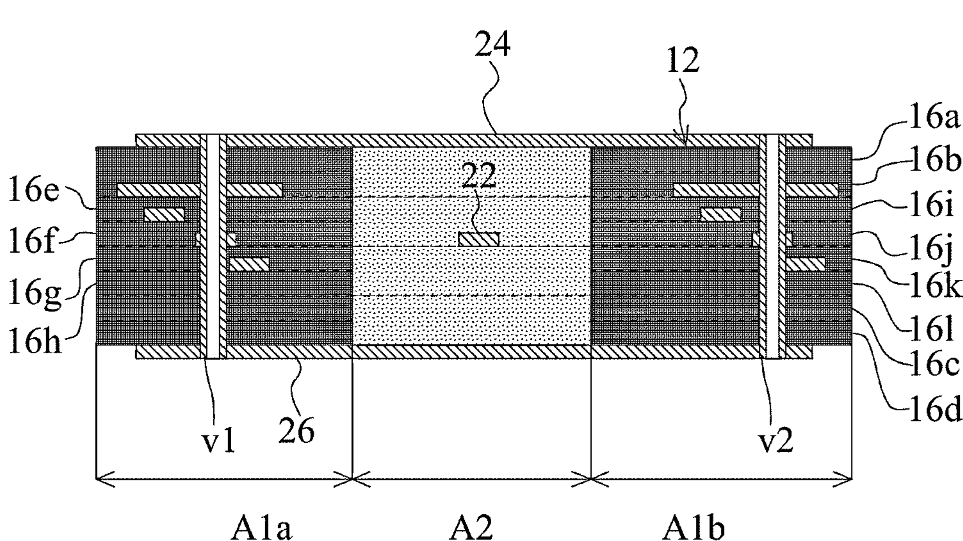
FIG. 19 is a sectional view of a multilayer substrate 10*k*.

The following describes a multilayer substrate 10*k* in an eleventh modification with reference to FIG. 19, which is a sectional view of the multilayer substrate 10*k*.

The multilayer substrate 10*k* differs from the multilayer substrate 10*h* in that the multilayer substrate 10*k* includes interlayer connection conductors that are through hole conductors. The interlayer connection conductors are denoted by v1 and v2. The interlayer connection conductors v1 and v2 each form an electrical connection between the first ground conductor layer 24 and the second ground conductor layer 26. The interlayer connection conductors v1 are connected to conductor layers disposed on the insulation layers 16*e* to 16*h*. The interlayer connection conductors v2 are connected to conductor layers disposed on the insulation layers 16*i* to 16*l*. The structure of the multilayer substrate 10*k* is otherwise similar to the structure of the multilayer substrate 10*h* and will not be further described. The effects produced by the multilayer substrate 10*k* may be comparable to those produced by the multilayer substrate 10*h*. The interlayer connection conductors v1 and v2 are disposed in the multilayer body 12 in the first regions A1*a* and A1*b*. The plating solution applied to form the interlayer connection conductors v1 and v2 is thus less likely to spread out into the inner portion of the multilayer body 12.

Twelfth Modification

Figure 20:
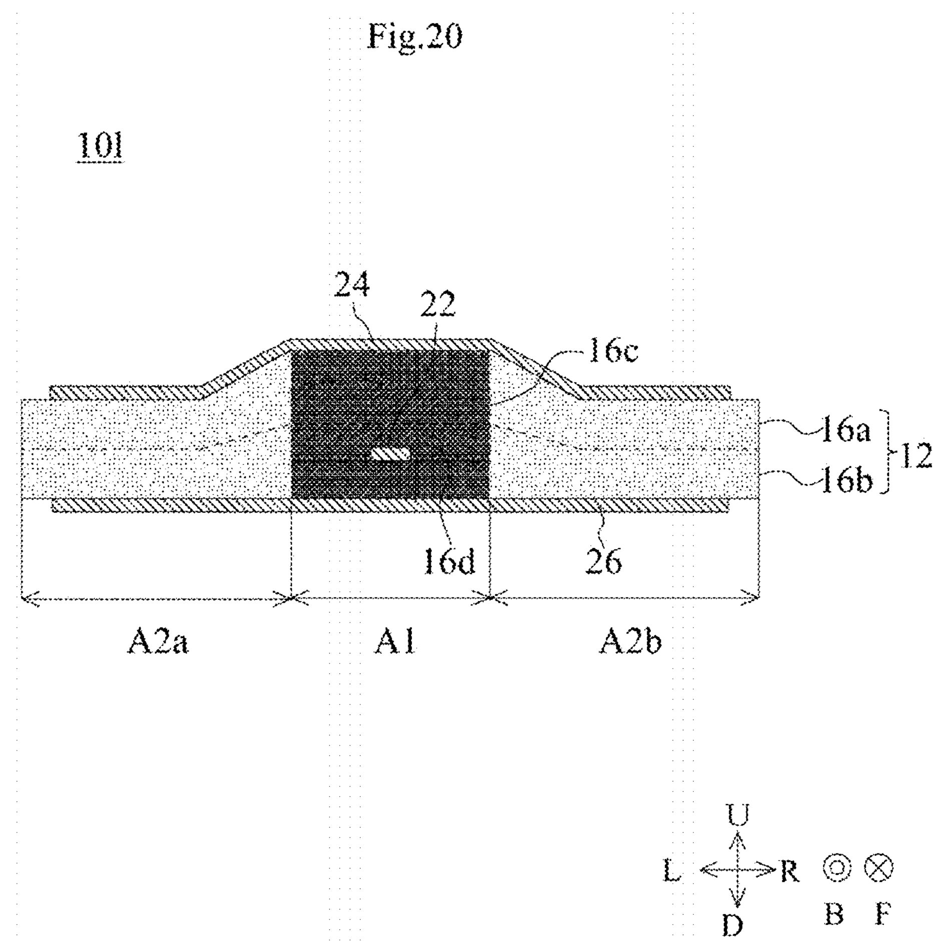
FIG. 20 is a sectional view of a multilayer substrate 10*l*.
Figure 21:
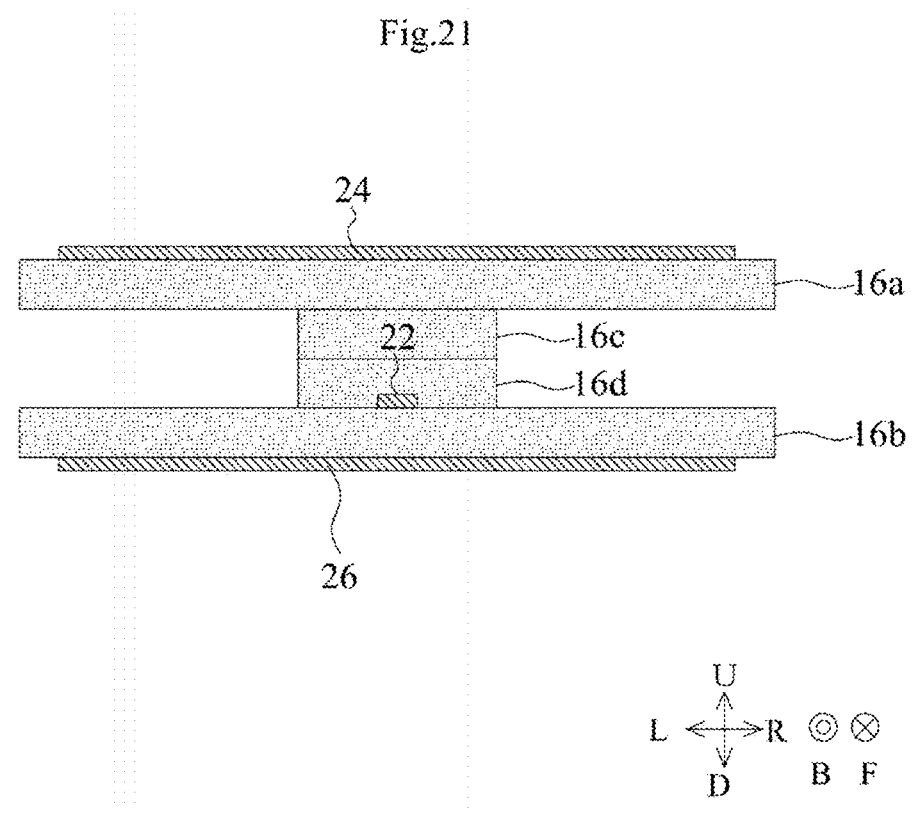

The following describes a multilayer substrate 10*l* in a twelfth modification with reference to FIGS. 20 and 21, which are sectional views of the multilayer substrate 10*l*. FIG. 21 illustrates the multilayer substrate 10*l* in the process of being manufactured.

The multilayer substrate 10*l* differs from the multilayer substrate 10 in that the signal conductor layer 22 is disposed on an upper main surface of the insulation layer 16*b* (porous insulation layer) in the first region A1 as will be described below in detail. The multilayer substrate 10*l* includes a first region and second regions. The first region is denoted by A1, and the second regions are denoted by A2*a* and A2*b*, respectively. The second region A2*a* is on the left side of the first region A1. The second region A2*b* is on the right side of the first region A1.

As illustrated in FIGS. 20 and 21, the insulation layers 16*a* and 16*b* are arranged in the stated order from top to bottom. The insulation layers 16*c* and 16*d* are located between the insulation layer 16*a* and the insulation layer 16*b* in the first region A1. The average void size of the insulation layers 16*a* to 16*d* (porous insulation layers) is smaller in the first region A1 than in the second regions A2*a* and A2*b*. The insulation layers 16*a* to 16*d* (porous insulation layers) are denser in the first region A1 than in the second regions A2*a* and A2*b*. The dimension of the multilayer body 12 in the up-and-down direction is greater in the first region A1 than in the second regions A2*a* and A2*b*.

The interlayer connection conductors v1 and v2 are not included in the multilayer substrate 10*l*. In some preferred embodiments, however, the interlayer connection conductors v1 and v2 are included in the multilayer substrate 10*l*. The structure of the multilayer substrate 10*l* is otherwise similar to the structure of the multilayer substrate 10 and will not be further described.

The effects produced by the multilayer substrate 10*l* may be comparable to those produced by the multilayer substrate 10. The multilayer body 12 of the multilayer substrate 10*l* is more rigid in the first region A1 and more flexible in the second regions A2*a* and A2*b*, and the dimension of the multilayer body 12 in the up-and-down direction is smaller in the second regions A2*a* and A2*b* than in the first region A1. Thus, the second regions A2*a* and A2*b* of the multilayer substrate 10*l* can be easily bent. The dielectric constant of the region around the signal conductor layer 22 is high, in which case the line width of the signal conductor layer 22 may be reduced without the possibility that the characteristic impedance of the signal conductor layer 22 will deviate from a predetermined value.

Thirteenth Modification

Figure 22:
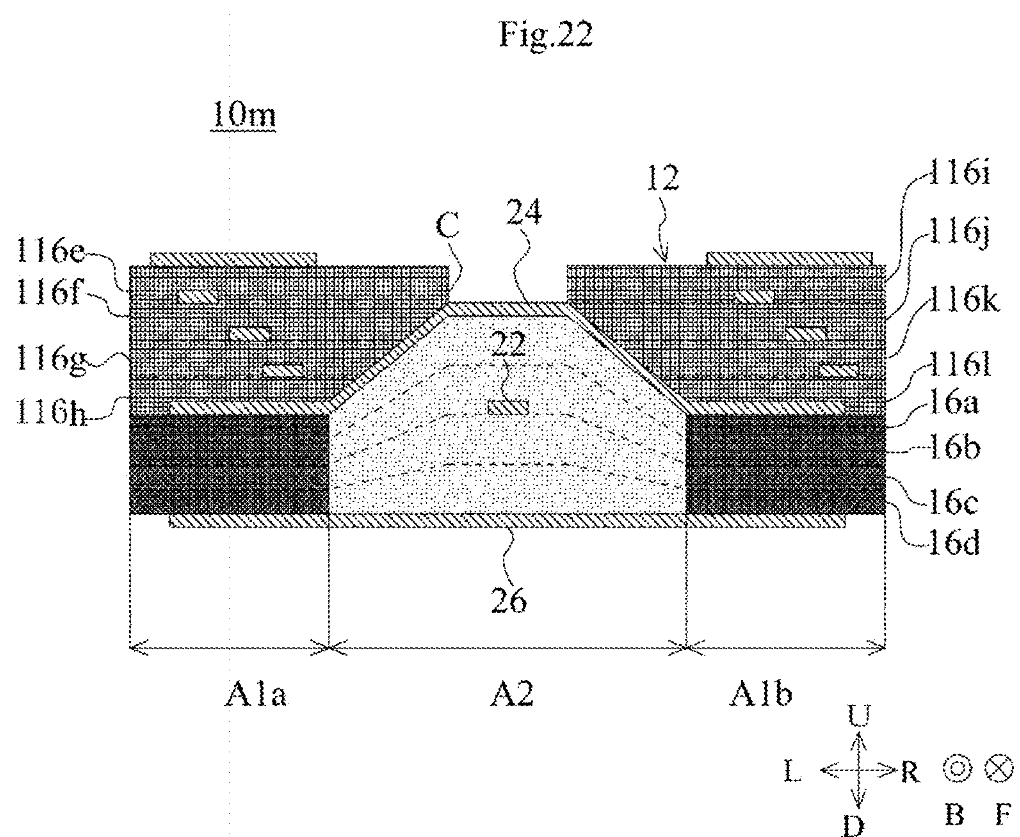
FIG. 22 is a sectional view of a multilayer substrate 10*m*.
Figure 23:
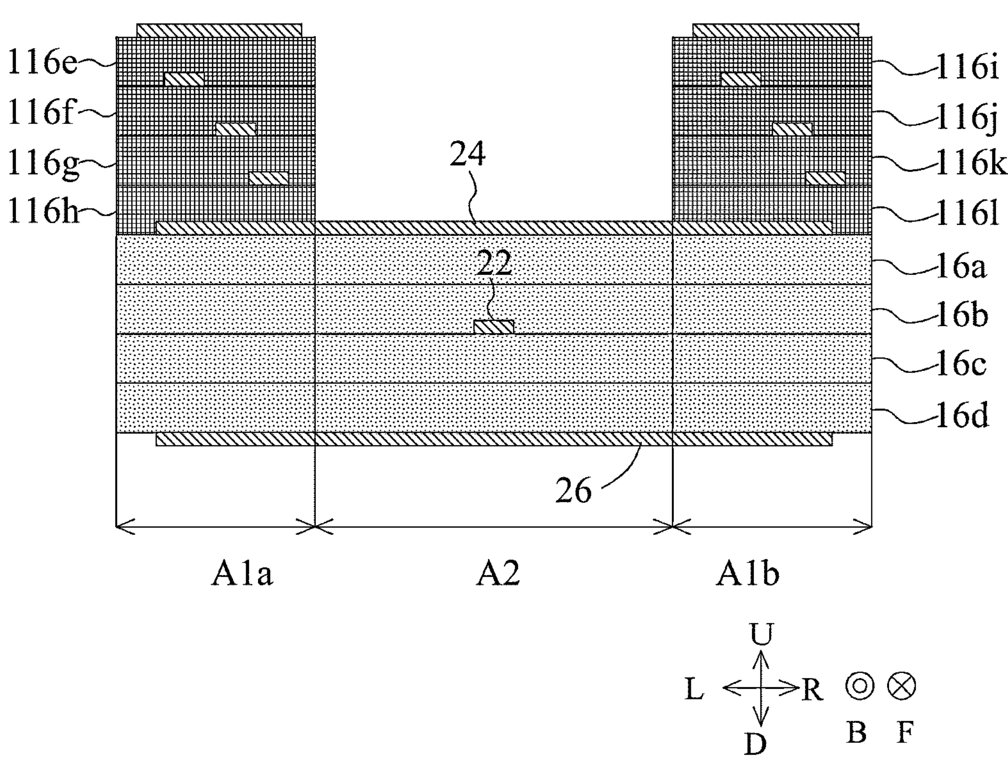
FIG. 23 is a sectional view of the multilayer substrate 10*m* in the process of being manufactured.

The following describes a multilayer substrate 10*m* in a thirteenth modification with reference to FIGS. 22 and 23, which are sectional views of the multilayer substrate 10*m*.

FIG. 23 illustrates the multilayer substrate 10*m* in the process of being manufactured.

The multilayer substrate 10*m* differs from the multilayer substrate 10*h* in that the multilayer body 12 includes the insulation layers 116*e* to 116*l* (see FIGS. 22 and 23) in place of the insulation layers 16*e* to 16*l*. The insulation layers 116*e* to 116*l* are not porous. That is, there are no deliberately made voids in the insulation layers 116*e* to 116*l*. The insulation layers 116*e* to 116*l* are denser than the insulation layers 16*a* to 16*d*. The degree to which the insulation layers 116*e* to 116*l* in the up-and-down direction in the pressing step illustrated in FIG. 23 is not that high. As illustrated in FIG. 22, the upper main surface of the multilayer body 12 is recessed downward in the second region A2. That is, the multilayer body 12 has a cavity C. The structure of the multilayer substrate 10*m* is otherwise similar to the structure of the multilayer substrate 10*h* and will not be further described.

The effects produced by the multilayer substrate 10*m* may be comparable to those produced by the multilayer substrate 10*h*. The dimension of the multilayer body 12 of the multilayer substrate 10*m* in the up-and-down direction is smaller in the second region A2 than in the other regions. Thus, the second region A2 of the multilayer substrate 10*m* can be easily bent. The multilayer body 12 of the multilayer substrate 10*m* is more rigid in the first regions A1*a* and A1*b* and more flexible in the second region A2. This structural feature of the multilayer substrate 10*m* can be attained by simple processes of stacking and compressing the insulation layers 16*a* to 16*d* and the insulation layers 116*e* to 116*l*.

Fourteenth Modification

Figure 24:
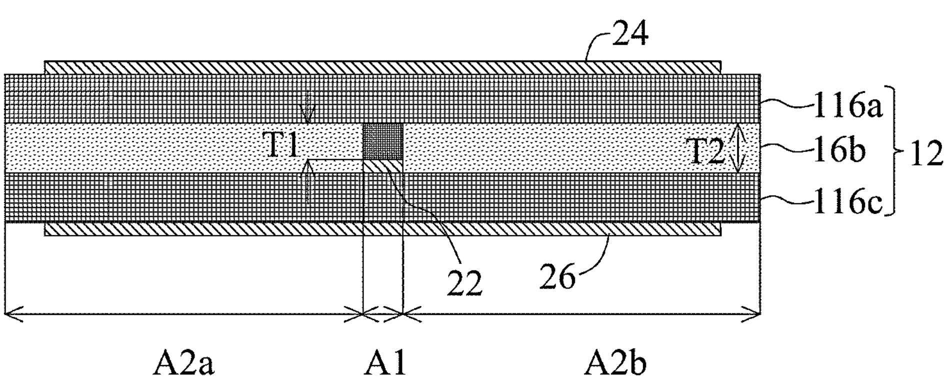
FIG. 24 is a sectional view of a multilayer substrate 10*n*.
Figure 25:
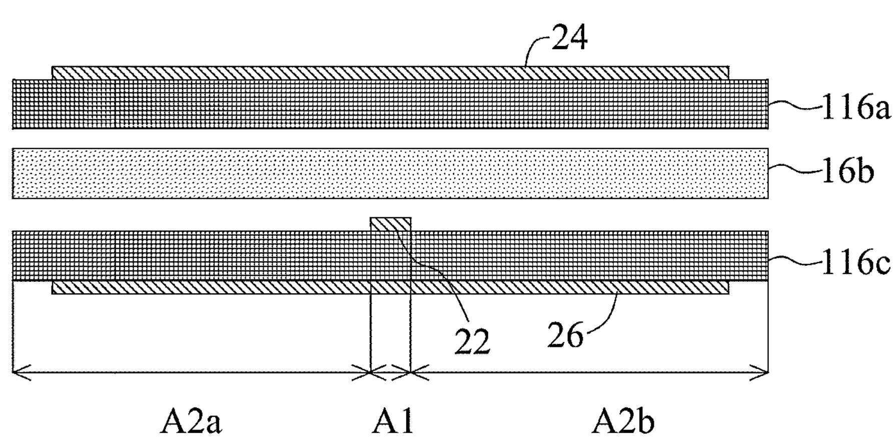
FIG. 25 is a sectional view of the multilayer substrate 10*n* in the process of being manufactured.

The following describes a multilayer substrate 10*n* in a fourteenth modification with reference to FIGS. 24 and 25, which are sectional views of the multilayer substrate 10*n*. FIG. 25 illustrates the multilayer substrate 10*n* in the process of being manufactured.

The multilayer substrate 10*n* differs from the multilayer substrate 10 in that an insulation layer 116*a*, the insulation layer 16*b*, and an insulation layer 116*c* are stacked in the up-and-down direction. To be more specific, the multilayer body 12 includes the insulation layers 116*a*, 16*b*, and 116*c* arranged in the stated order from top to bottom. The insulation layer 16*b* is a porous insulation layer made of a porous material, whereas the insulation layers 116*a* and 116*c* are not porous. That is, there are no deliberately made voids in the insulation layers 116*a* and 116*c*.

The signal conductor layer 22 is disposed on the upper main surface of the insulation layer 116*c*. The first ground conductor layer 24 is disposed on an upper main surface of the insulation layer 116*a*. The second ground conductor layer 26 is disposed on a lower main surface of the insulation layer 116*c*.

The multilayer substrate 10*n* includes a first region and second regions. The first region is denoted by A1, and the second regions are denoted by A2*a* and A2*b*, respectively. The signal conductor layer 22 is located in the first region A1 of the multilayer substrate 10 when viewed in the up-and-down direction. The second region A2*a* is on the left side of the first region A1. The second region A2*b* is on the right side of the first region A1. The dimension of the insulation layer 16*b* (porous insulation layer) in the up-and-down direction is smaller in the first region A1 than in the second regions A2*a* and A2*b*. That is, T1 is less than T2, where T1 denotes the thickness of the insulation layer 16*b* in the first region A1, and T2 denotes the thickness of the insulation layer 16*b* in the second regions A2*a* and A2*b*. The structure of the multilayer substrate 10*n* is otherwise similar to the structure of the multilayer substrate 10 and will not be further described.

The multilayer substrate 10*n* is manufactured in the following manner. The insulation layers 116*a*, 16*b*, and 116*c* are arranged in the stated order from top to bottom as illustrated in FIG. 25. Subsequently, the insulation layers 116*a*, 16*b*, and 116*c* are pressed in the up-and-down direction. The layers in the region in which the signal conductor layer 22 is located is greater in number than the layers in the regions in which the signal conductor layer 22 is not located. Thus, the degree of compression of the portions being portion of the insulation layer 16*b* and pressed against the signal conductor layer 22 in the up-and-down direction is higher than the degree of compression of the portion being portion of the insulation layer 16*b* and not overlapping the signal conductor layer 22 in the up-and-down direction. The dimension of the insulation layer 16*b* (porous insulation layer) in the up-and-down direction is smaller in the first region A1 than in the second regions A2*a* and A2*b*. That is, T1 is less than T2, where T1 denotes the thickness of the insulation layer 16*b* in the first region A1, and T2 denotes the thickness of the insulation layer 16*b* in the second regions A2*a* and A2*b*. The effects produced by the multilayer substrate 10*n* may be comparable to those produced by the multilayer substrate 10. Furthermore, the upper main surface and the lower main surface of the multilayer body 12 of the multilayer substrate 10*n* may be flattened out.

Fifteenth Modification

Figure 26:
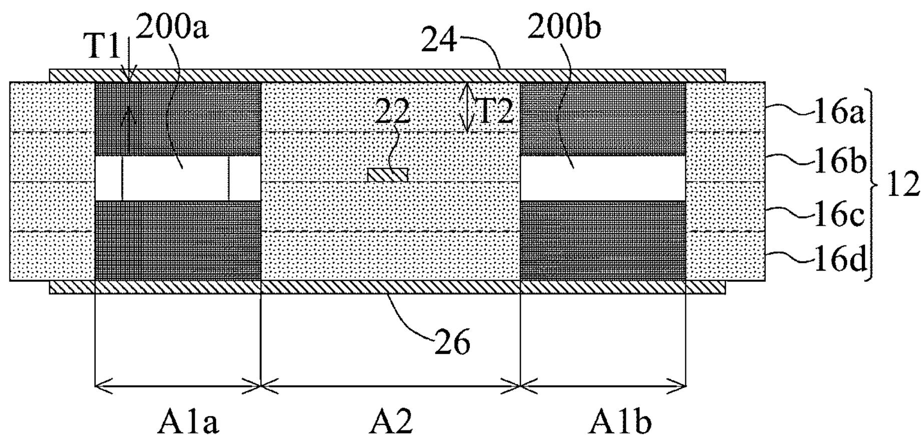
FIG. 26 is a sectional view of a multilayer substrate 10*o*.
Figure 27:
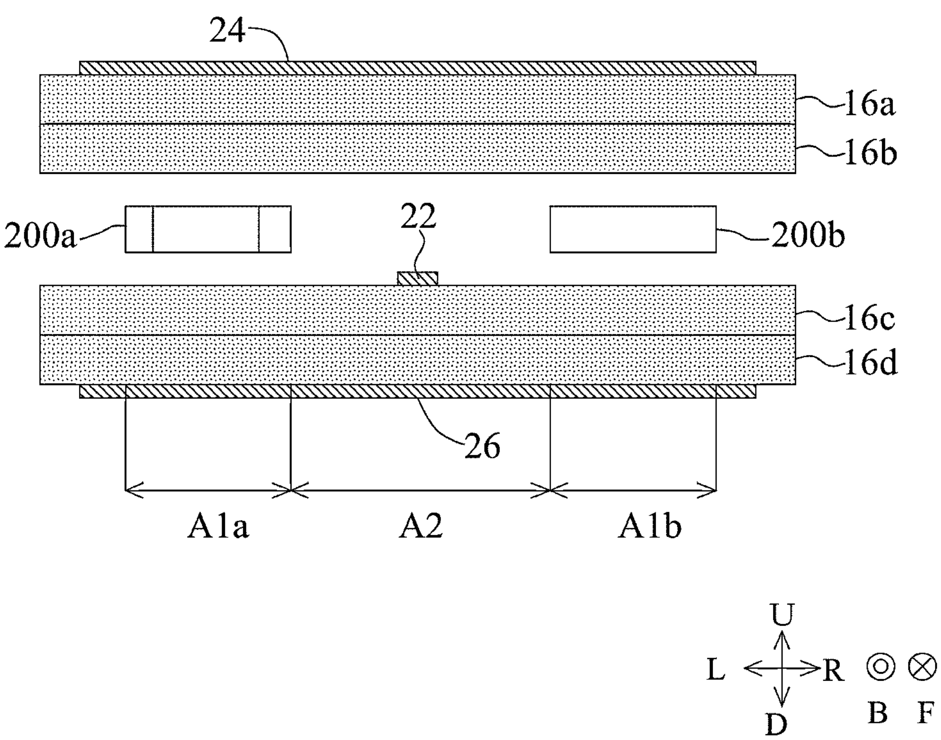
FIG. 27 is a sectional view of the multilayer substrate 10*o* in the process of being manufactured.

The following describes a multilayer substrate 10*o* in a fifteenth modification with reference to FIGS. 26 and 27, which are sectional views of the multilayer substrate 10*o*. FIG. 27 illustrates the multilayer substrate 10*o* in the process of being manufactured.

The multilayer substrate 10*o* differs from the multilayer substrate 10 in that the multilayer substrate 10*o* includes components 200*a* and 200*b*, which are incorporated in the multilayer body 12 in the first regions A1*a* and A1*b*, respectively. To be more specific, the insulation layers 16*a* to 16*d* are arranged in the stated order from top to bottom. The components 200*a* and 200*b* are disposed between the insulation layer 16*c* and the insulation layer 16*d*. The components 200*a* and 200*b* are electronic components in chip form or integrated circuit (IC) devices. The electronic components in chip form may be capacitors or inductors.

The multilayer substrate 10*o* includes first regions and a second region. The first regions are denoted by A1*a* and A1*b*, respectively. The second region is denoted by A2. The component 200*a* is located in the first region A1*a* of the multilayer substrate 10*o* when viewed in the up-and-down direction. The first region A1*a* is on the left side of the second region A2. The component 200*b* is located in the first region A1*b* of the multilayer substrate 10*o* when viewed in the up-and-down direction. The first region A1*b* is on the right side of the second region A2. The dimension of each of the insulation layers 16*a* to 16*d* (porous insulation layers) in the up-and-down direction is smaller in the first regions A1*a* and A1*b* than in the second region A2. That is, T1 is less than T2, where T1 denotes the thickness of each of the insulation layers 16*a* to 16*d* in the first regions A1*a* and A1*b*, and T2 denotes the thickness of each of the insulation layers 16*a* to 16*d* in the second region A2. The structure of the multilayer substrate 10*o* is otherwise similar to the structure of the multilayer substrate 10 and will not be further described.

The multilayer substrate 10*o* is manufactured in the following manner. The insulation layers 16*a* to 16*d* are arranged in the stated order from top to bottom as illustrated in FIG. 27. The components 200*a* and 200*b* are disposed between the insulation layer 16*b* and the insulation layer 16*c* before the insulation layers 16*a* to 16*d* are pressed in the up-and-down direction. The region in which the components 200*a* and 200*b* are located is thicker than the regions in which the components 200*a* and 200*b* is not located, where the thickness refers to the dimension in the up-and-down direction. Thus, the degree of compression of the portions being portion of the insulation layers 16*a* to 16*d* and pressed against the components 200*a* and 200*b* in the up-and-down direction is higher than the portion being portion of the insulation layers 16*a* to 16*d* and not overlapping the components 200*a* and 200*b* in the up-and-down direction. Thus, the dimension of each of the insulation layers 16*a* to 16*d* (porous insulation layers) in the up-and-down direction is smaller in the first regions A1*a* and A1*b* than in the second region A2. That is, T1 is less than T2, where T1 denotes the thickness of each of the insulation layers 16*a* to 16*d* in the first regions A1*a* and A1*b*, and T2 denotes the thickness of each of the insulation layers 16*a* to 16*d* in the second region A2.

The effects produced by the multilayer substrate 10*o* may be comparable to those produced by the multilayer substrate 10. Furthermore, the portion surrounding the components 200*a* and 200*b* of the multilayer substrate 10*o* is rigid. That is, the portion being portion of the multilayer body 12 and surrounding the components 200*a* and 200*b* is reinforced. This provides protection for the components 200*a* and 200*b*. The components 200*a* and 200*b* of the multilayer substrate 10*o* are incorporated in the multilayer body 12 in the first regions A1*a* and A1*b*, respectively. The components 200*a* and 200*b* are thus more protected from the entry of liquid and gas from the outside of the multilayer body 12.

Sixteenth Modification

Figure 28:
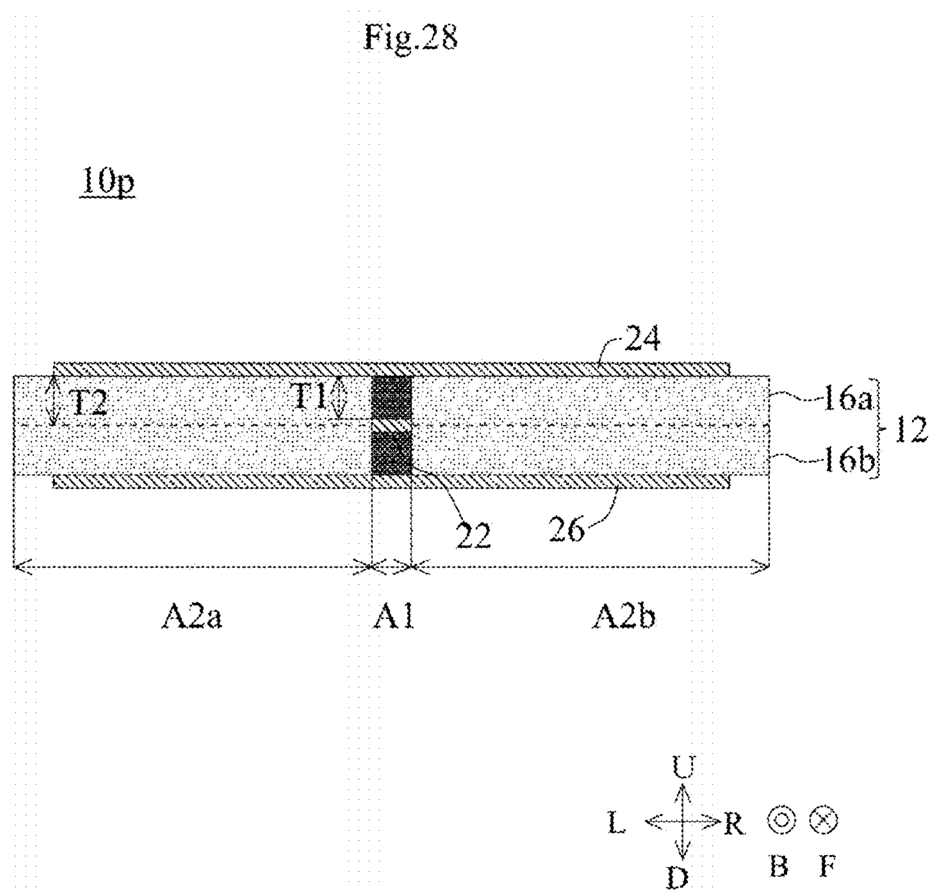
FIG. 28 is a sectional view of a multilayer substrate 10*p*.
Figure 29:
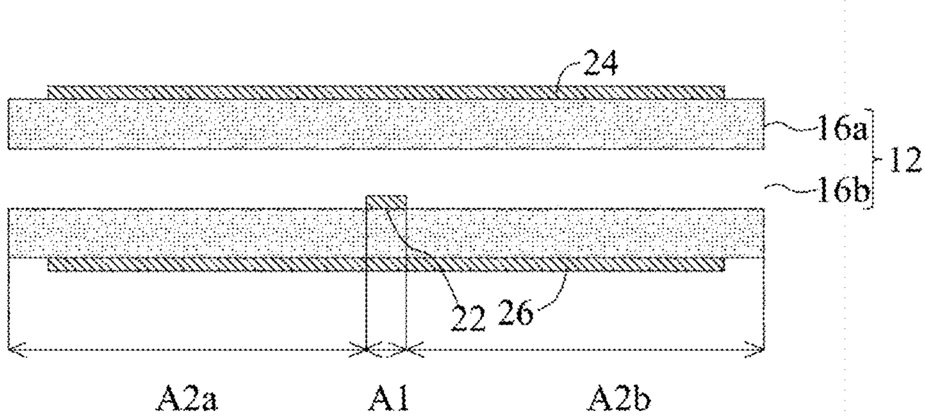
FIG. 29 is a sectional view of the multilayer substrate 10*p* in the process of being manufactured.

The following describes a multilayer substrate 10*p* in a sixteenth modification with reference to FIGS. 28 and 29, which are sectional views of the multilayer substrate 10*p*. FIG. 29 illustrates the multilayer substrate 10*p* in the process of being manufactured.

The multilayer substrate 10*p* differs from the multilayer substrate 10*n* in that the insulation layers 16*a* and 16*b* are stacked in the up-and-down direction. To be more specific, the insulation layers 16*a* and 16*b* in the multilayer body 12 are arranged in the stated order from top to bottom. The signal conductor layer 22 is disposed on the upper main surface of the insulation layer 16*b*. The first ground conductor layer 24 is disposed on the upper main surface of the insulation layer 16*a*. The second ground conductor layer 26 is disposed on the lower main surface of the insulation layer 16*b*.

The multilayer substrate 10*p* includes a first region and second regions. The first region is denoted by A1, and the second regions are denoted by A2*a* and A2*b*, respectively. The signal conductor layer 22 is located in the first region A1 of the multilayer substrate 10*p* when viewed in the up-and-down direction. The second region A2*a* is on the left side of the first region A1. The second region A2*b* is on the right side of the first region A1. The dimension of each of the insulation layers 16*a* and 16*b* (porous insulation layer) in the up-and-down direction is smaller in the first region A1 than in the second regions A2*a* and A2*b*. That is, T1 is less than T2, where T1 denotes the thickness of each of the insulation layers 16*a* and 16*b* in the first region A1, and T2 denotes the thickness of each of the insulation layers 16*a* and 16*b* in the second regions A2*a* and A2*b*.

One-half or more of the signal conductor layer 22 in the up-and-down direction is embedded in the insulation layer 16*b* (porous insulation layer). The upper half of the signal conductor layer 22 in the present preferred embodiment is embedded in the insulation layer 16*a*. The lower half of the signal conductor layer 22 in the present preferred embodiment is embedded in the insulation layer 16*b*. The structure of the multilayer substrate 10*p* is otherwise similar to the structure of the multilayer substrate 10*n* and will not be further described.

The multilayer substrate 10*p* is manufactured in the following manner. The insulation layers 16*a* and 16*b* are arranged in the stated order from top to bottom as illustrated in FIG. 29. Subsequently, the insulation layers 16*a* and 16*b* are pressed in the up-and-down direction. The layers in the region in which the signal conductor layer 22 is located is greater in number than the layers in the regions in which the signal conductor layer 22 is not located. Thus, the degree of compression of the portions being portion of the insulation layers 16*a* and 16*b* and pressed against the signal conductor layer 22 in the up-and-down direction is higher than the degree of compression of the portion being portion of the insulation layers 16*a* and 16*b* and not overlapping the signal conductor layer 22 in the up-and-down direction. The dimension of each of the insulation layers 16*a* and 16*b* (porous insulation layers) in the up-and-down direction is smaller in the first region A1 than in the second regions A2*a* and A2*b*. That is, T1 is less than T2, where T1 denotes the thickness of each of the insulation layers 16*a* and 16*b* in the first region A1, and T2 denotes the thickness of each of the insulation layer 16*a* and 16*b* in the second regions A2*a* and A2*b*.

The effects produced by the multilayer substrate 10*p* may be comparable to those produced by the multilayer substrate 10*n*. Furthermore, the upper main surface and the lower main surface of the multilayer body 12 of the multilayer substrate 10*p* may be flattened out. The upper half of the signal conductor layer 22 of the multilayer substrate 10*p* is embedded in the insulation layer 16*a*, and the lower half of the signal conductor layer 22 of the multilayer substrate 10*p* is embedded in the insulation layer 16*b*. That is, the signal conductor layer 22 is located in the midsection of the multilayer body 12 in the up-and-down direction. The signal conductor layer 22 of the multilayer substrate 10*p* is located in the first region A1. Placing the signal conductor layer 22 as mentioned above yields an increase in the dielectric constant of the region around the signal conductor layer 22. The value of the characteristic impedance in the signal conductor layer 22 may be reduced accordingly.

Seventeenth Modification

Figure 30:
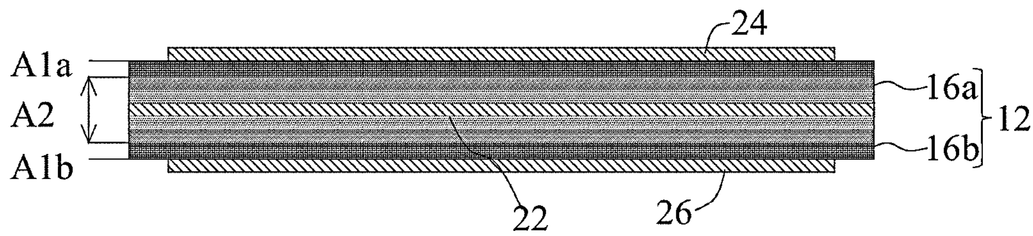
FIG. 30 is a sectional view of a multilayer substrate 10*q*.

The following describes a multilayer substrate 10*q* in a seventeenth modification with reference to FIG. 30, which is a sectional view of the multilayer substrate 10*q*.

The multilayer substrate 10*q* differs from the multilayer substrate 10*p* in that the first regions A1*a* and A1*b* and the second region A2 are adjacent to each other in the up-and-down direction. The voids in the insulation layers 16*a* and 16*b* (porous insulation layers) increase in size with increasing proximity to the midsection of the multilayer body 12 in the up-and-down direction. The insulation layers 16*a* and 16*b* (porous insulation layers) decrease in density with increasing proximity to the midsection of the multilayer body 12 in the up-and-down direction. The region including the upper main surface of the multilayer body 12 and the region including the lower main surface of the multilayer body 12 are thus regarded as first regions and are denoted by A1*a* and A1*b*, respectively. Conversely, the region including the midsection of the multilayer body 12 in the up-and-down direction is thus regarded as a second region and is denoted by A2. The structure of the multilayer substrate 10*q* is otherwise similar to the structure of the multilayer substrate 10*p* and will not be further described.

The multilayer substrate 10*q* is manufactured in the following manner. Dies heated to high temperatures are pressed against the insulation layers 16*a* and 16*b*. The region including the upper main surface of the insulation layer 16*a* and the region including the lower main surface of the insulation layer 16*b* are subject to heat transferred from the dies such that the insulation layers 16*a* and 16*b* soften and become deformed more in the region than in the other region. As a result, voids in the region including the upper main surface of the insulation layer 16*a* and voids in the region including the lower main surface of the insulation layer 16*b* are compressed in the pressing step. Thus, the voids in the insulation layers 16*a* and 16*b* (porous insulation layers) increase in size with increasing proximity to the midsection of the multilayer body 12 in the up-and-down direction.

The effects produced by the multilayer substrate 10*q* may be comparable to those produced by the multilayer substrate 10*p*. Furthermore, placing the signal conductor layer 22 as mentioned above yields reductions in the dielectric constant and the dielectric dissipation factor in the region around the signal conductor layer 22 of the multilayer substrate 10*q*. The dielectric loss in the signal conductor layer 22 may be reduced accordingly. The insulation layers 16*a* and 16*b* (porous insulation layers) of the multilayer substrate 10*q* are denser in the regions including the upper main surface and the lower main surface, respectively, of the multilayer body 12. The multilayer substrate 10*q* is thus more resistant to deformation.

Eighteenth Modification

Figure 31:
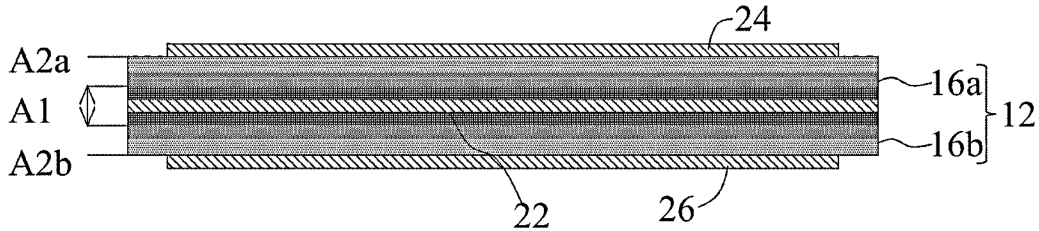
FIG. 31 is a sectional view of a multilayer substrate 10*r*.

The following describes a multilayer substrate 10*r* in an eighteenth modification with reference to FIG. 31, which is a sectional view of the multilayer substrate 10*r*.

The multilayer substrate 10*r* differs from the multilayer substrate 10*q* in that the first region A1 and the second regions A2*a* and A2*b* of the multilayer substrate 10*r* are in inverse order to the aforementioned regions of the multilayer substrate 10*q*. The voids in the insulation layers 16*a* and 16*b* (porous insulation layers) decrease in size with increasing proximity to the midsection of the multilayer body 12 in the up-and-down direction. The insulation layers 16*a* and 16*b* (porous insulation layers) increase in density with increasing proximity to the midsection of the multilayer body 12 in the up-and-down direction. The region including the upper main surface of the multilayer body 12 and the region including the lower main surface of the multilayer body 12 are thus regarded as second regions and are denoted by A2*a* and A2*b*, respectively. Conversely, the region including the midsection of the multilayer body 12 in the up-and-down direction is thus regarded as a first region and is denoted by A1. The structure of the multilayer substrate 10*r* is otherwise similar to the structure of the multilayer substrate 10*q* and will not be further described.

The multilayer substrate 10*r* is manufactured in the following manner. Dies are pressed against the insulation layers 16*a* and 16*b* in a state in which the entirety of the multilayer body 12 is heated to a uniform temperature. Accordingly, the insulation layers 16*a* and 16*b* are entirely compressed in the up-and-down direction, and the insulation layers 16*a* and 16*b* are bonded to each other. Then, the temperature of the multilayer body 12 is lowered, whereas the region including the lower main surface of the insulation layer 16*a* and the region including the upper main surface of the insulation layer 16*b* are raised in temperature. As a result, voids in the region including the lower main surface of the insulation layer 16*a* and voids in the region including the upper main surface of the insulation layer 16*b* expand.

The effects produced by the multilayer substrate 10*q* may be comparable to those produced by the multilayer substrate 10*r*. The elastic modulus of the multilayer body 12 of the multilayer substrate 10*r* is lower in the regions including the upper main surface and the lower main surface of multilayer body 12 than in the other region. Thus, the multilayer substrate 10*r* can be easily bent. The elastic modulus of the multilayer body 12 of the multilayer substrate 10*r* is higher in the region including the signal conductor layer 22. The multilayer body 12 can thus provide protection for the signal conductor layer 22.

Nineteenth Modification

Figure 32:
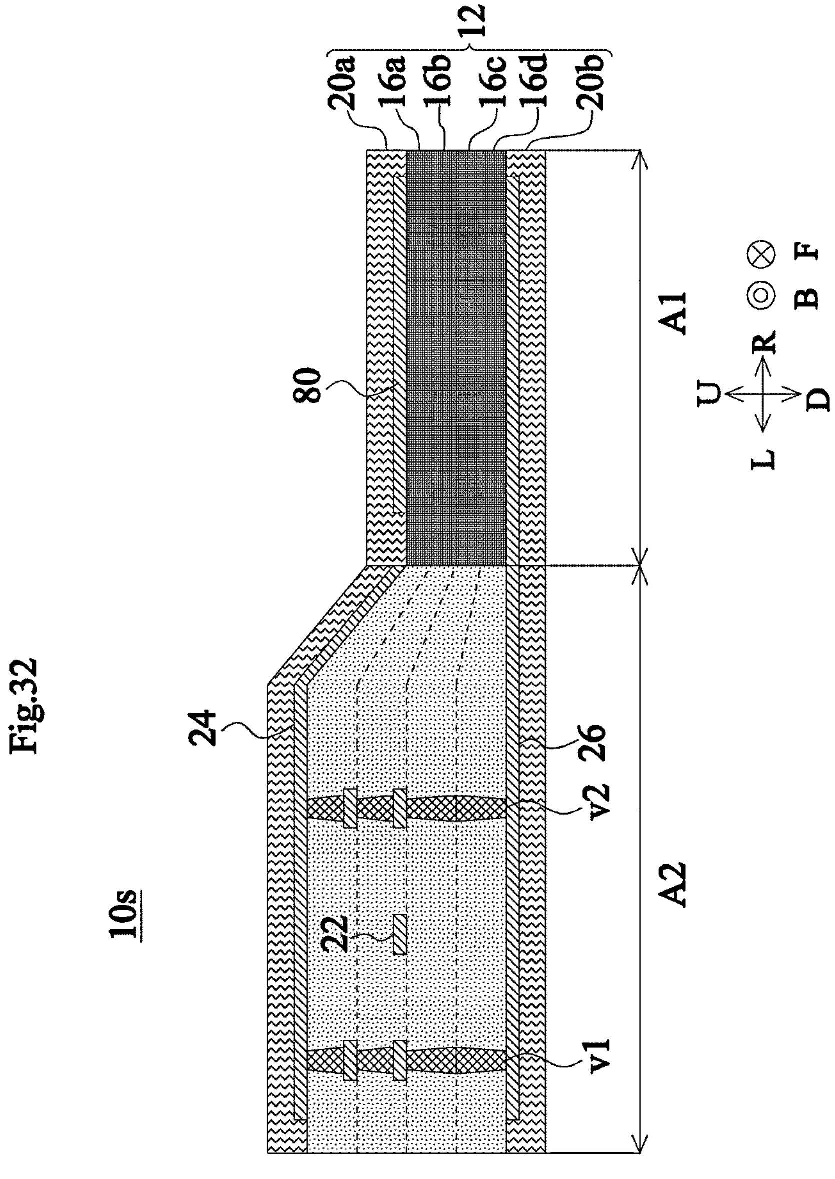
FIG. 32 is a sectional view of a multilayer substrate 10*s*.

The following describes a multilayer substrate 10*s* in a nineteenth modification with reference to FIG. 32, which is a sectional view of the multilayer substrate 10*s*.

The multilayer substrate 10*s* differs from the multilayer substrate 10*b* in that the multilayer substrate 10*s* includes an antenna conductor layer 80 in place of the first capacitor conductor layer 30 and the second capacitor conductor layer 32. The antenna conductor layer 80 is disposed in the multilayer body 12 in the first region A1. The antenna conductor layer 80 in this modification is disposed on the upper main surface of the insulation layer 16*a* (porous insulation layer) in the first region A1. The structure of the multilayer substrate 10*s* is otherwise similar to the structure of the multilayer substrate 10*b* and will not be further described.

The effects produced by the multilayer substrate 10*s* may be comparable to those produced by the multilayer substrate 10*b*. The antenna conductor layer 80 of the multilayer substrate 10*s* is disposed in the multilayer body 12 in the first region A1. The dielectric constant of the insulation layers 16*a* to 16*d* is higher in the first region A1 than in the second region A2. For this reason, radio-frequency signals of short wavelengths are transmitted through the antenna conductor layer 80. The antenna conductor layer 80 can thus be made compact in size.

Twentieth Modification

Figure 33:
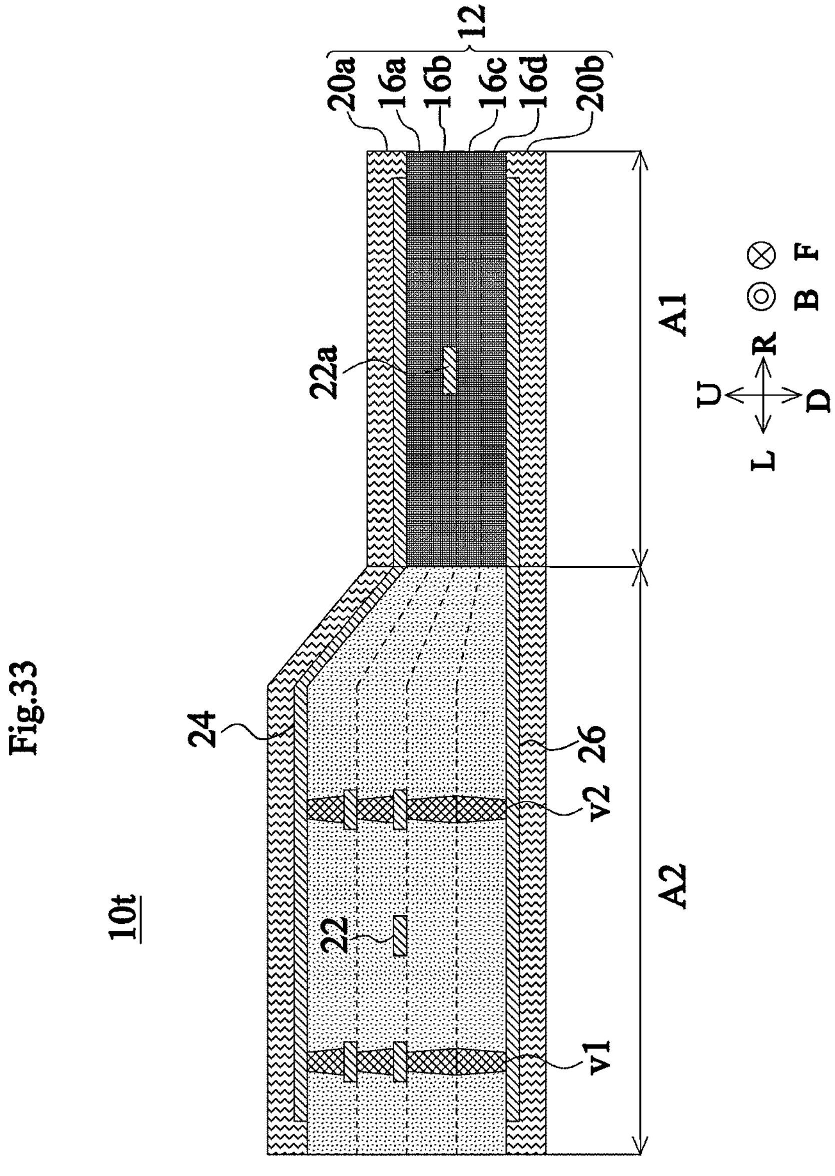
FIG. 33 is a sectional view of a multilayer substrate 10*t*.

The following describes a multilayer substrate 10*t* in a twentieth modification with reference to FIG. 33, which is a sectional view of the multilayer substrate 10*t*.

The multilayer substrate 10*t* differs from the multilayer substrate 10*s* in that the multilayer substrate 10*t* includes a signal conductor layer 22*a* in place of the antenna conductor layer 80. The signal conductor layer 22*a* is disposed in the multilayer body 12 in the first region A1. The structure of the multilayer substrate 10*t* is otherwise similar to the structure of the multilayer substrate 10*s* and will not be further described.

The effects produced by the multilayer substrate 10*t* may be comparable to those produced by the multilayer substrate 10*s*. Furthermore, the dimension of the multilayer substrate 10*t* in the left-and-right direction is reduced. To be more specific, the signal conductor layer 22*a* is disposed in the multilayer body 12 in the first region A1. The dielectric constant of first region A1 is higher than the dielectric constant of the second region A2. The dimension of the multilayer body 12 in the up-and-down direction is smaller in the first region A1 than in the second region A2. The reduction in thickness in the first region A1 induces an increase in the capacitance of the signal conductor layer 22*a* in the first region A1. The line width of the signal conductor layer 22*a* in the left-and-right direction can be reduced while sufficient capacitance is maintained between the signal conductor layer 22*a* and the first ground conductor layer 24 and between the signal conductor layer 22*a* and the second ground conductor layer 26. Accordingly, the dimension of the multilayer substrate 10*t* in the left-and-right direction can be reduced.

Twenty-First Modification

Figure 34:
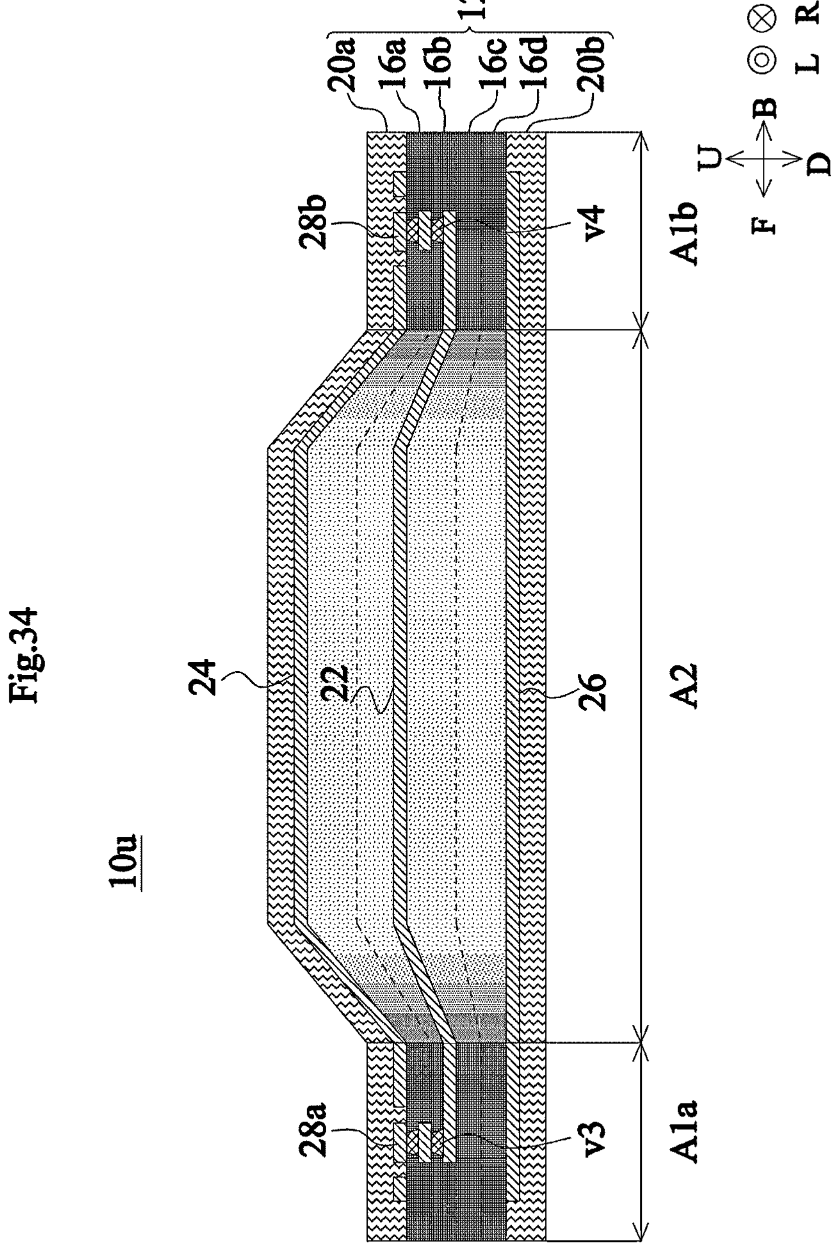
FIG. 34 is a sectional view of a multilayer substrate 10*u*.

The following describes a multilayer substrate 10*u* in a twenty-first modification with reference to FIG. 34, which is a sectional view of the multilayer substrate 10*u*.

The difference between the multilayer substrate 10 and the multilayer substrate 10*u* is in the arrangement of the first regions A1*a* and A1*b* and the second region A2, as will be described below in detail. The first region A1*a* is in the upper end portion of the multilayer substrate 10*u*. The first region A1*b* is in the back end portion of the multilayer substrate 10*u*. The voids in the insulation layers 16*a* to 16*d* (porous insulation layers) in the second region A2 decrease in size with increasing proximity to the boundary between the first region A1*a* and the second region A2 and the boundary between the first region A1*b* and the second region A2. The insulation layers 16*a* to 16*d* (porous insulation layers) in the second region A2 increase in density with increasing proximity to the boundary between the first region A1*a* and the second region A2 and the boundary between the first region A1*b* and the second region A2. The structure of the multilayer substrate 10*u* is otherwise similar to the structure of the multilayer substrate 10 and will not be further described. The changes in the dielectric constant at the boundary between the first region A1*a* and the second region A2 and the boundary between the first region A1*b* and the second region A2 are not that steep. Thus, there is less likely to be a steep change in value of the characteristic impedance in the signal conductor layer 22. Thus, radio-frequency signals in the signal conductor layer 22 are less prone to reflection. The dimension of the multilayer substrate 10*u* in the up-and-down direction is smaller in the front end portion and the back end portion than in the other portion of the multilayer substrate 10*u*. The front end portion and the back end portion of the multilayer substrate 10*u* are mounting regions for connectors. This yields a reduction in the dimension of the multilayer substrate 10*u* in the up-and-down direction.

Twenty-Second Modification

Figure 35:
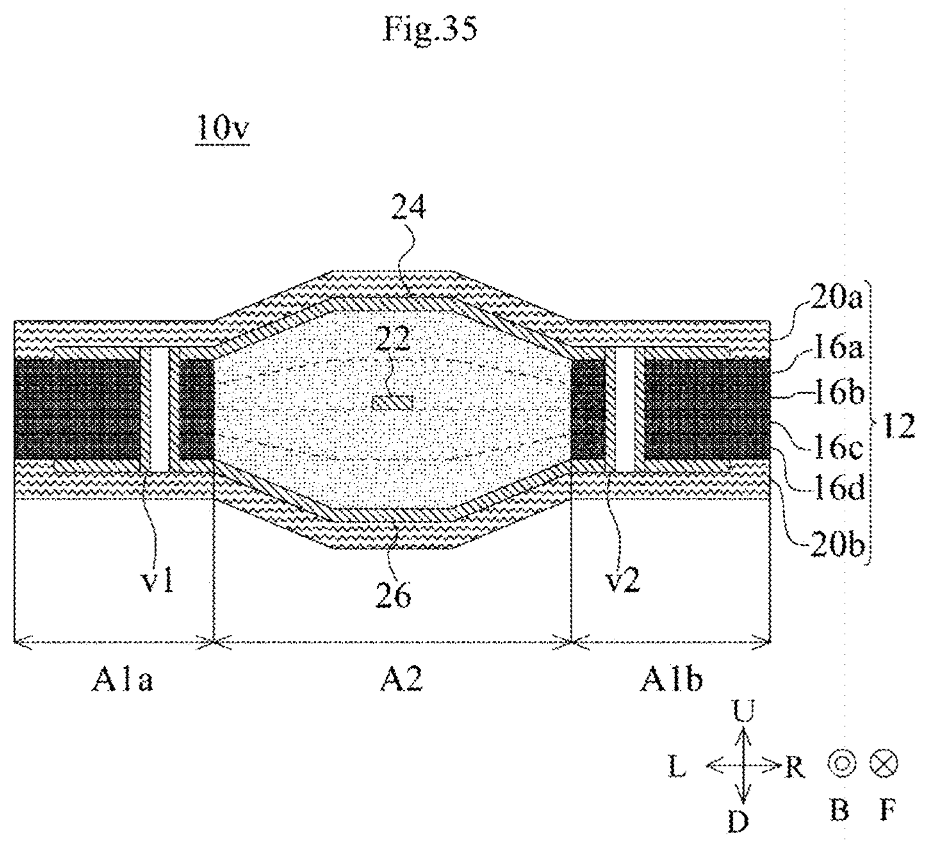
FIG. 35 is a sectional view of a multilayer substrate 10*v*.

The following describes a multilayer substrate 10*v* in a twenty-second modification with reference to FIG. 35, which is a sectional view of the multilayer substrate 10*v*.

The multilayer substrate 10*v* differs from the multilayer substrate 10*a* in that the neither the upper main surface nor the lower main surface of the multilayer substrate 10*v* is flat. The multilayer substrate 10*a* is obtained in the pressing step in which dies are pressed against the insulation layers 16*a* to 16*d* in the up-and-down direction. Each of the dies is geometrically identical to the die T100 illustrated in FIG. 5. The multilayer body 12 pressed by the dies protrude upward and downward in the second region A2 such that level differences in the upper surface and the lower main surface of the multilayer body 12 are located between the second region A2 and each of the first regions A1*a* and A1*b*. The structure of the multilayer substrate 10*v* is otherwise similar to the structure of the multilayer substrate 10*a* and will not be further described. The effects produced by the multilayer substrate 10*v* may be comparable to those produced by the multilayer substrate 10*a*.

Twenty-Third Modification

Figure 36:
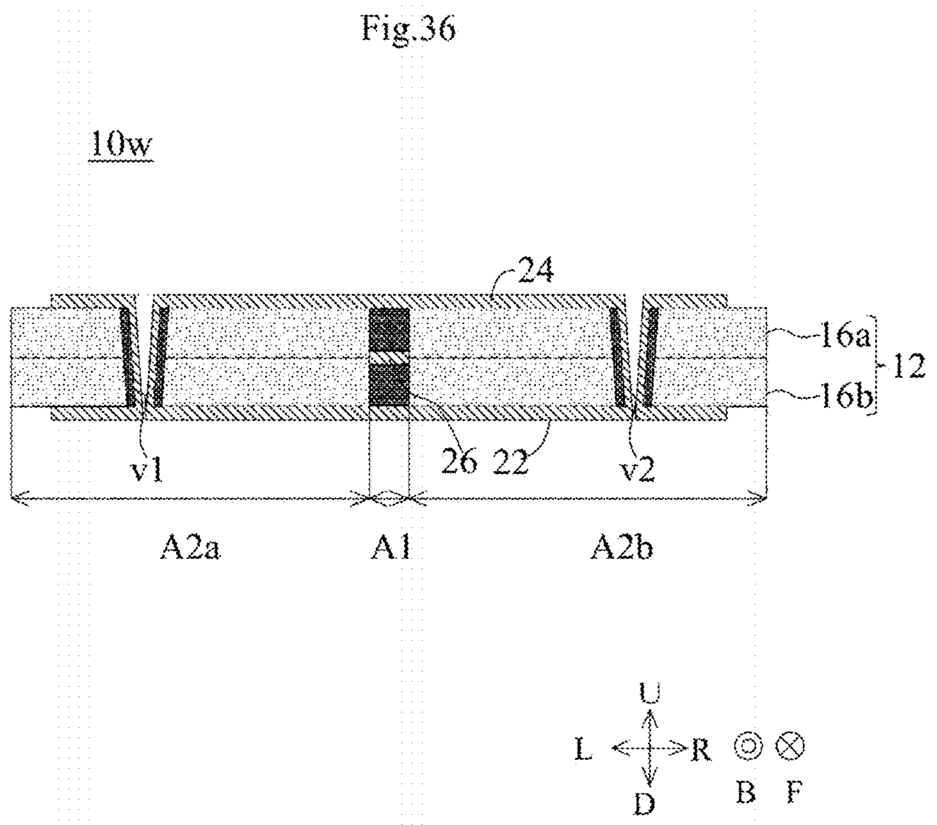
FIG. 36 is a sectional view of a multilayer substrate 10*w*.
Figure 37:
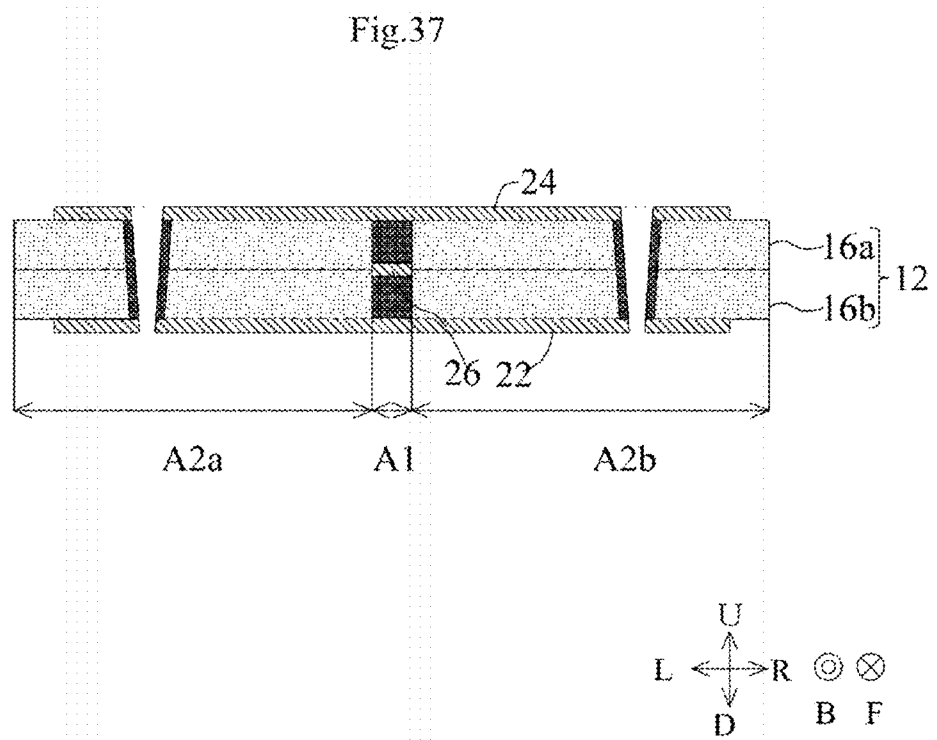
FIG. 37 is a sectional view of the multilayer substrate 10*w* in the process of being manufactured.

The following describes a multilayer substrate 10*w* in a twenty-third modification with reference to FIG. 36, which is a sectional view of the multilayer substrate 10*w*. FIG. 37 illustrates the multilayer substrate 10*w* in the process of being manufactured.

The multilayer substrate 10*w* differs from the multilayer substrate 10*p* in that the multilayer substrate 10*w* includes interlayer connection conductors extending through the insulation layers 16*a* and 16*b* (porous insulation layers) in the up-and-down direction. The interlayer connection conductors are denoted by v1 and v2. Structural features of the multilayer substrate 10 include (C) and (D).

(C) The average void size of the insulation layers 16*a* and 16*b* (porous insulation layers) is smaller in the portion adjacent to the interlayer connection conductors v1 and v2 than in the second regions A2*a* and A2*b*.

(D) The insulation layers 16*a* and 16*b* (porous insulation layers) are denser in the portion adjacent to the interlayer connection conductors v1 and v2 than in the second regions A2*a* and A2*b*.

As illustrated in FIG. 37, through holes are formed in the interlayer connection conductors v1 and v2 in the process of production. The through holes are formed through the use of a drill, a die, laser beams, or the like. While the through holes are formed, the die or the drill exerts pressure on inner peripheral surfaces of the through holes, or the laser beams cause the melting of the inner peripheral surfaces of the through holes. As a result, voids in the vicinity of the through holes are compressed. Structural features of the multilayer substrate 10*w* obtained in this manner thus include (C) and (D). The structure of the multilayer substrate 10*w* is otherwise similar to the structure of the multilayer substrate 10*p* and will not be further described.

The effects produced by the multilayer substrate 10*w* may be comparable to those produced by the multilayer substrate 10*p*. Furthermore, a plating solution applied to the inner peripheral surfaces of the through holes is less likely to spread out into the inner portion of the multilayer body 12 of the multilayer substrate 10*w*. The inner peripheral surfaces of the through holes can be coated with resin while the through holes are formed in the multilayer substrate 10*w*.

Twenty-Fourth Modification

Figure 38:
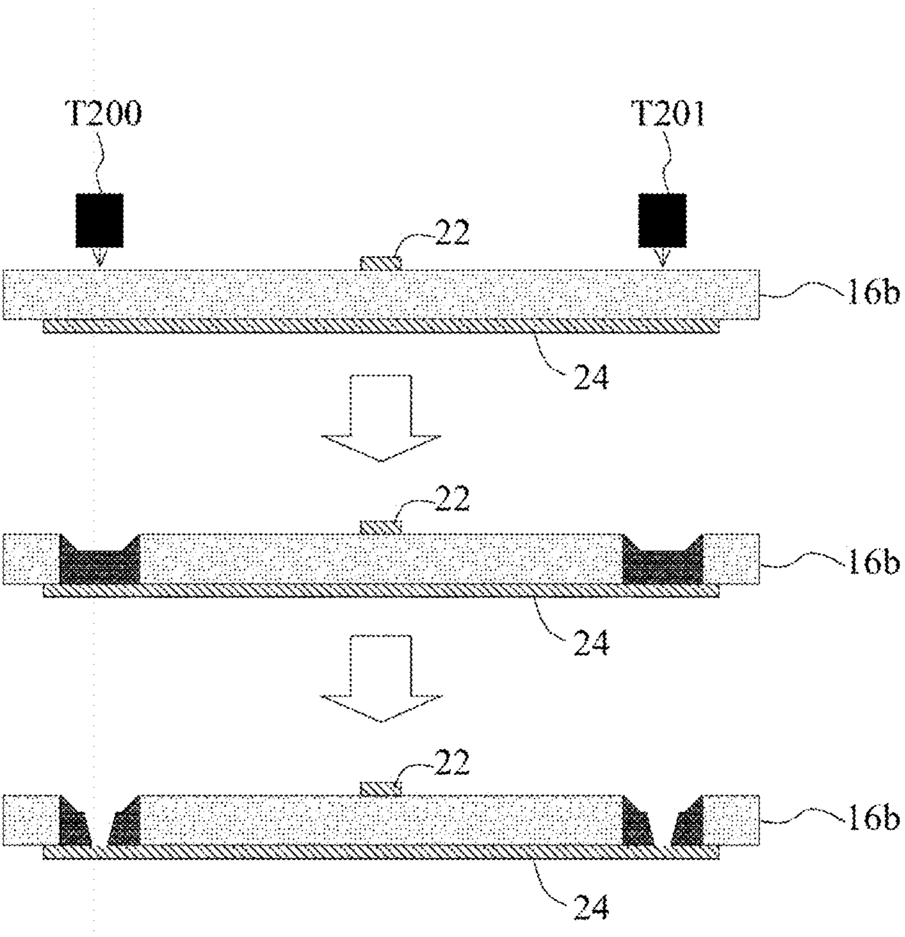
FIG. 38 is a sectional view of the multilayer substrate 10 in the process of being manufactured.

The following describes a method for manufacturing a multilayer substrate 10 in a twenty-fourth modification with FIG. 38, which is a sectional view of the multilayer substrate 10 in the process of being manufactured.

The method for manufacturing the multilayer substrate 10 in the twenty-fourth modification differs from the aforementioned method for manufacturing the multilayer substrate 10 in that the insulation layer 16*b* (porous insulation layer) is pressed before the insulation layers 16_a_ and 16_b_ are stacked in the stacking step. To be more specific, a die T200 and a die T201 are pressed against portion of the insulation layer 16_b_ prior to the stacking step. The average void size of the pressed portion of the insulation layer 16_b_ is smaller than the average void size of the other portion of the insulation layer 16_b_. The pressed portion of the insulation layer 16_b_ is denser than the other portion of the insulation layer 16_b_.

Subsequently, through holes are formed in the pressed portion of the insulation layer 16_b_. The through holes are then filled with the conductive paste (not illustrated). In the following step, the insulation layers 16_a_ and 16_b_ are arranged in a stack and are then pressed. The conductive paste is solidified through the application of pressure and is thus formed into the interlayer connection conductors v1 and v2. The vicinity of the interlayer connection conductors v1 and v2 are formed into the second regions A2_a_ and A2_b_.

Twenty-Fifth Modification

Figure 39:
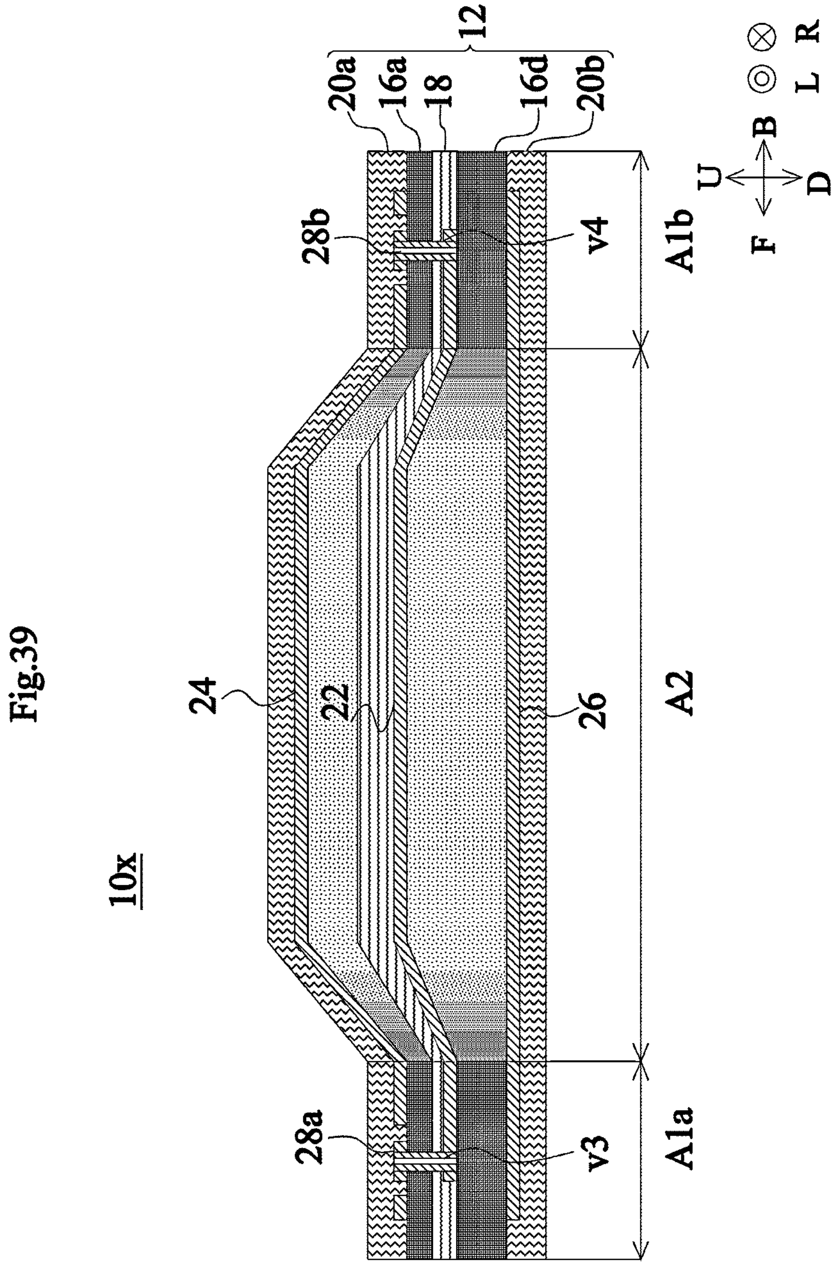
FIG. 39 is a sectional view of a multilayer substrate 10*x*.

The following describes a multilayer substrate 10_x_ in a twenty-fifth modification with reference to FIG. 39, which is a sectional view of the multilayer substrate 10_x_.

The multilayer substrate 10_x_ differs from the multilayer substrate 10_u_ in that an insulation layer 18 is included in the multilayer body 12 in place of the insulation layers 16_b_ and 16_c_. To be more specific, the insulation layer 16_a_ and 16_d_ (porous insulation layers) and the insulation layer 18 are included in the multilayer body 12. The insulation layer 18 is an adhesive layer with which the insulation layer 16_a_ (porous insulation layer) and the insulation layer 16_d_ (porous insulation layer) are bonded to each other. The dielectric constant of the insulation layer 18 is higher than the dielectric constant of the insulation layers 16_a_ and 16_d_. The dielectric dissipation factor of the insulation layer 18 is lower than the dielectric dissipation factor of the insulation layers 16_a_ and 16_d_. For example, the insulation layer 18 is made of fluororesin, in which case the insulation layer 18 can meet the requirement pertaining to the dielectric dissipation factor. The insulation layer 18 may be made of epoxy resin or acrylic resin. The structure of the multilayer substrate 10_x_ is otherwise similar to the structure of the multilayer substrate 10_u_ and will not be further described.

The effects produced by the multilayer substrate 10_x_ may be comparable to those produced by the multilayer substrate 10_u_. Furthermore, the multilayer substrate 10_x_ does not necessitate the melting and softening of the materials of the insulation layers 16_a_ and 16_d_ in the process of bonding the insulation layers 16_a_ and 16_d_ to each other. Accordingly, the scope of material selection for the insulation layers 16_a_ and 16_d_ is widened. The signal conductor layer 22 of the multilayer substrate 10_x_ is disposed on the upper main surface of the insulation layer 16_d_, and the resultant level difference is accommodated by the insulation layer 18. For this reason, there is not much difference in void size between the vicinity of the signal conductor layer 22 and the other region.

Other Preferred Embodiments

Examples of multilayer substrates according to preferred embodiments of the present invention are not limited to the multilayer substrates 10 and 10_a_ to 10_x_, which may be altered within a range not departing from the gist of the present invention. The present invention may involve varying combinations of the structural features of the multilayer substrates 10 and 10_a_ to 10_x_.

The multilayer substrates 10 and 10_a_ to 10_x_ each may include a conductor layer in place of the signal conductor layer 22. For example, a ground conductor layer or a power conductor layer may be included in place of the signal conductor layer.

The first ground conductor layer 24 and the second ground conductor layer 26 may be optionally included in the multilayer substrates 10 and 10_a_ to 10_x_.

Likewise, the interlayer connection conductors v1 and the interlayer connection conductors v2 may be optionally included in the multilayer substrates 10 and 10_a_ to 10_x_.

The signal terminals 28_a_ and 28_b_ of each of the multilayer substrates 10 and 10_a_ to 10_x_ may be disposed on the lower main surface of the multilayer body 12.

Components other than the connectors 30_a_ and 30_b_ may be mounted on the multilayer substrates 10 and 10_a_ to 10_x_.

The multilayer substrates 10 and 10_a_ to 10_x_ are in a linear form when viewed in the up-and-down direction. In some preferred embodiment, however, the multilayer substrates 10 and 10_a_ to 10_x_ are curved. This means that the multilayer substrates 10 and 10_a_ to 10_x_ are curved with no external force exerted thereon.

The insulation layer 18 may be a resin sheet bonded to the upper main surface of the insulation layer 16_d_ or may be obtained by the application of resin in liquid form to the upper main surface of the insulation layer 16_d_.

The dielectric constant of the insulation layer 18 may be higher than or equal to the dielectric constant of the insulation layers 16_a_ and 16_d_, and the dielectric dissipation factor of the insulation layer 18 may be lower than the dielectric dissipation factor of the insulation layers 16_a_ and 16_d_. Alternatively, the dielectric constant of the insulation layer 18 may be lower than the dielectric constant of the insulation layers 16_a_ and 16_d_, and the dielectric dissipation factor of the insulation layer 18 may be higher than or equal to the dielectric dissipation factor of the insulation layers 16_a_ and 16_d_. Still alternatively, the dielectric constant of the insulation layer 18 may be higher than or equal to the dielectric constant of the insulation layers 16_a_ and 16_d_, and the dielectric dissipation factor of the insulation layer 18 may be higher than or equal to the dielectric dissipation factor of the insulation layers 16_a_ and 16_d_.

It is required that structural features of each of the multilayer substrates 10 and 10_a_ to 10_x_ include (A) and/or (B).

It is not required that the voids in the porous insulation layer of each of the multilayer substrates 10 and 10_a_ to 10_x_ be discrete air bubbles.

The antenna conductor layer 80 of the multilayer substrate 10_s_ may be disposed on the lower main surface of the insulation layer 16_a_ (porous insulation layer) in the first region A1. Instead of being disposed on the insulation layer 16_a_, the antenna conductor layer 80 of the multilayer substrate 10_s_ may be disposed on the upper main surface or the lower main surface of any one of the insulation layers 16_b_ to 16_d_ in the first region A1.

The signal conductor layer 22 may be disposed on the lower main surface of the porous insulation layer in the first region.

It is required that structural features of each of the multilayer substrates 10_w_ include (C) and/or (D).

It is required that structural features of each of the multilayer substrates 10 and 10_a_ to 10_x_ include (E) and/or (F).

With regard to the multilayer substrate 10_g_, it is required that the average void size of the insulation layers 16_a_ to 16_d_ (porous insulation layers) under the stress caused by the bending of the first section A12 of the multilayer substrate 10*g* be smaller in the first region A1 than in the second regions A2*a* and A2*b*, and/or it is required that the insulation layers 16*a* to 16*d* (porous insulation layers) under the stress caused by the bending of the first section A12 of the multilayer substrate 10*g* be denser in the first region A1 than in the second regions A2*a* and A2*b*.

It is not required that one-half or more of the conductor layer in the up-and-down direction be embedded in the porous insulation layer.

The component 40 may be disposed on the lower main surface of the multilayer body 12 of the multilayer substrate 10*c*.

With regard to the multilayer substrates 10 and 10*a* to 10*x*, it is required that structural features of at least one of the porous insulation layers of the multilayer body 12 include (A) and/or (B). This means that not all the porous insulation layers of the multilayer body 12 necessarily involve (A) and/or (B).

The signal conductor layer 22 of the multilayer substrate 10*p* may be disposed on the lower main surface of the insulation layer 16*a*.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:

a multilayer body including a plurality of insulation layers stacked on top of one another in an up-and-down direction, the plurality of insulation layers including a porous insulation layer; wherein the multilayer substrate includes a first region and a second region;

a dimension of the porous insulation layer in the up-and-down direction is smaller in the first region than in the second region;

at least one of an average void size of the porous insulation layer is smaller in the first region than in the second region, or the porous insulation layer is denser in the first region than in the second region;

the porous insulation layer is a closed-cell foam in which major voids are discrete bubbles that are entirely surrounded with a material of the porous insulation layer;

at least one of an average void size of the voids is smaller in the first region than in the second region, or the voids are configured in the porous insulation layer such that the porous insulation layer is denser in the first region than in the second region;

the multilayer substrate includes a first section and a second section;

the first section is curved; and the first section is located in the first region.

2. The multilayer substrate according to claim 1, wherein the major voids are discrete air bubbles.

3. The multilayer substrate according to claim 1, further comprising:

a conductor layer on an upper main surface or a lower main surface of the porous insulation layer; wherein one-half or more of the conductor layer in the up-and-down direction is embedded in the porous insulation layer.

4. The multilayer substrate according to claim 1, wherein a dimension of the multilayer body in the up-and-down direction is smaller in the first region than in the second region.

5. The multilayer substrate according to claim 1, further comprising a component on an upper main surface or a lower main surface of the multilayer body in the first region.

6. The multilayer substrate according to claim 1, wherein the first section of the multilayer substrate is bent in an upward direction or a downward direction defined relative to the second section.

7. The multilayer substrate according to claim 1, further comprising an antenna conductor layer on an upper main surface or a lower main surface of the porous insulation layer in the first region.

8. The multilayer substrate according to claim 1, further comprising:

a conductor layer on an upper main surface or a lower main surface of the porous insulation layer in the first region; and an interlayer connection conductor located in the first region and extending through the porous insulation layer in the up-and-down direction, the interlayer connection conductor being connected to the conductor layer.

9. The multilayer substrate according to claim 8, wherein when viewed in the up-and-down direction, the first region has a shape that encompasses a circle with a diameter equal or substantially equal to a minimum width of the conductor layer in a cross section passing through the interlayer connection conductor and extending in the up-and- down direction.

10. The multilayer substrate according to claim 1, wherein the insulation layers in the first region are greater in number than the insulation layers in the second region.

11. The multilayer substrate according to claim 1, further comprising an interlayer connection conductor located in the first region and extending through the porous insulation layer in the up-and-down direction.

12. The multilayer substrate according to claim 1, further comprising:

an interlayer connection conductor extending through the porous insulation layer in the up-and-down direction; wherein at least one of an average void size of the porous insulation layer is smaller in a portion adjacent to the interlayer connection conductor than in the second region, or the porous insulation layer is denser in the portion adjacent to the interlayer connection conductor than in the second region.

13. The multilayer substrate according to claim 1, further comprising:

a first capacitor conductor layer in the multilayer body in the first region; and a second capacitor conductor layer in the multilayer body in the first region, the second capacitor conductor layer overlapping the first capacitor conductor layer when viewed in the up-and-down direction; wherein the porous insulation layer is located between the first capacitor conductor layer and the second capacitor conductor layer.

14. The multilayer substrate according to claim 1, further comprising a component included in the multilayer body in the first region.

15. The multilayer substrate according to claim 1, further comprising a conductor layer on an upper main surface or a lower main surface of the porous insulation layer, the conductor layer being included in a radio-frequency circuit.

16. The multilayer substrate according to claim 1, wherein the first section of the multilayer substrate is bent in an upward direction or a downward direction defined relative to the second section;

with the porous insulation layer being under stress caused by bending of the first section of the multilayer substrate, a dimension of the porous insulation layer in the up-and-down direction is smaller in the first region than in the second region; and at least one of an average void size of the porous insulation layer under the stress caused by the bending of the first section of the multilayer substrate is smaller in the first region than in the second region, or the porous insulation layer under the stress caused by the bending of the first section of the multilayer substrate is denser in the first region than in the second region.

17. The multilayer substrate according to claim 1, wherein at least one of voids in the porous insulation layer in the second region decrease in size with increasing proximity to a boundary between the first region and the second region, or the porous insulation layer in the second region increases in density with increasing proximity to the boundary between the first region and the second region.

18. The multilayer substrate according to claim 1, wherein the plurality of insulation layers include a plurality of the porous insulation layers; and voids in the plurality of porous insulation layers decrease in size with increasing proximity to a midsection of the multilayer body in the up-and-down direction.

19. The multilayer substrate according to claim 1, wherein the plurality of insulation layers include a plurality of the porous insulation layers; and voids in the plurality of porous insulation layers increase in size with increasing proximity to a midsection of the multilayer body in the up-and-down direction.

20. The multilayer substrate according to claim 1, wherein the plurality of insulation layers include a plurality of the porous insulation layers and an adhesive layer with which the plurality of porous insulation layers are bonded to each other.

21. An electronic apparatus comprising the multilayer substrate according to claim 1.

* * * * *